(12) United States Patent
Choi et al.

(10) Patent No.: US 12,274,135 B2
(45) Date of Patent: Apr. 8, 2025

(54) DISPLAY PANEL INCLUDING A PLURALITY OF GROOVES FOR SEPARATING ORGANIC MATERIAL LAYERS AND ELECTRODES AND A DISPLAY APPARATUS INCLUDING THE SAME

(71) Applicant: SAMSUNG DISPLAY CO., LTD., Yongin-si (KR)

(72) Inventors: Wonsuk Choi, Yongin-si (KR); Hyunchul Kim, Yongin-si (KR); Seongryong Lee, Yongin-si (KR); Eunae Jung, Yongin-si (KR); Yoonsun Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/432,548

(22) Filed: Feb. 5, 2024

(65) Prior Publication Data

US 2024/0179963 A1 May 30, 2024

Related U.S. Application Data

(63) Continuation of application No. 17/693,747, filed on Mar. 14, 2022, now Pat. No. 11,895,876, which is a
(Continued)

(30) Foreign Application Priority Data

May 13, 2019 (KR) .......................... 10-2019-0055836

(51) Int. Cl.
*H01L 29/08* (2006.01)
*H10K 50/844* (2023.01)
(Continued)

(52) U.S. Cl.
CPC ......... *H10K 59/124* (2023.02); *H10K 50/844* (2023.02); *H10K 59/1213* (2023.02); *H10K 59/1216* (2023.02); *H10K 59/122* (2023.02)

(58) Field of Classification Search
CPC ............... H10K 59/124; H10K 59/122; H10K 59/1213; H10K 59/1216; H10K 50/844
(Continued)

(56) References Cited

U.S. PATENT DOCUMENTS 6,091,078 A 7/2000 Codama
9,905,629 B2 2/2018 Kim et al.
(Continued)

FOREIGN PATENT DOCUMENTS

CN 110224006 9/2019
JP 3078257 6/2000
(Continued)

*Primary Examiner* — Phuc T Dang
(74) *Attorney, Agent, or Firm* — F. CHAU & ASSOCIATES, LLC

(57) ABSTRACT

A display panel includes: a substrate including a first area, a second area, and a third area between the first area and the second area; a first structure located in the second area and including a pixel electrode, an opposite electrode, an intermediate layer between the pixel electrode and the opposite electrode, and at least one organic material layer; and a plurality of grooves located in the third area and separating the at least one organic material layer and the opposite electrode, wherein a first groove of the plurality of grooves is provided in a multi-layered film including a lower layer and an upper layer, wherein the upper layer includes an inorganic material layer and a first step adjacent to the first groove, the first step having an elevation higher than an upper surface of the lower layer.

20 Claims, 27 Drawing Sheets

Related U.S. Application Data continuation of application No. 16/872,696, filed on May 12, 2020, now Pat. No. 11,276,738.

(51) Int. Cl.
*H10K 59/121* (2023.01)
*H10K 59/122* (2023.01)
*H10K 59/124* (2023.01)

(58) Field of Classification Search
USPC .......................................................... 257/40
See application file for complete search history.

(56) References Cited

U.S. PATENT DOCUMENTS

| | | | |
|---|---|---|---|
| 10,205,122 B2 | 2/2019 | Choi et al. | |
| 11,245,093 B2 | 2/2022 | Sung et al. | |
| 11,276,738 B2 | 3/2022 | Choi et al. | |
| 2016/0087244 A1* | 3/2016 | Kim | H10K 59/8052 257/40 |
| 2017/0125505 A1 | 5/2017 | Oh | |
| 2017/0148856 A1 | 5/2017 | Choi et al. | |
| 2017/0186781 A1 | 6/2017 | Noh et al. | |
| 2017/0330923 A1* | 11/2017 | Chung | H01L 27/1288 |
| 2018/0097048 A1 | 4/2018 | Kimura et al. | |
| 2018/0157362 A1 | 6/2018 | Kim et al. | |
| 2018/0183015 A1 | 6/2018 | Yun et al. | |
| 2019/0035867 A1 | 1/2019 | Choung et al. | |
| 2019/0051859 A1 | 2/2019 | Choi et al. | |
| 2019/0074479 A1 | 3/2019 | Lee et al. | |
| 2019/0081273 A1 | 3/2019 | Sung et al. | |
| 2019/0181205 A1 | 6/2019 | Kim | |
| 2019/0237703 A1 | 8/2019 | Kim et al. | |
| 2020/0365672 A1 | 11/2020 | Choi et al. | |
| 2020/0365825 A1 | 11/2020 | Yu | |
| 2022/0199723 A1 | 6/2022 | Choi et al. | |

FOREIGN PATENT DOCUMENTS

| | | | |
|---|---|---|---|
| KR | 10-2017-0059864 | 5/2017 | |
| KR | 10-2017-0115177 A | 10/2017 | |
| KR | 10-2018-0063633 | 6/2018 | |
| KR | 10-2018-0076429 | 7/2018 | |
| KR | 10-2019-0029830 A | 3/2019 | |
| KR | 10-2019-0093830 | 8/2019 | |
| WO | WO-2019012768 A1 * | 1/2019 | ............... G09F 9/00 |

* cited by examiner

DISPLAY PANEL INCLUDING A PLURALITY OF GROOVES FOR SEPARATING ORGANIC MATERIAL LAYERS AND ELECTRODES AND A DISPLAY APPARATUS INCLUDING THE SAME

CROSS-REFERENCE TO RELATED APPLICATIONS

This application is a continuation of U.S. patent application Ser. No. 17/693,747 filed on Mar. 14, 2022, now U.S. Pat. No. 11,895,876, which is a continuation of U.S. patent application Ser. No. 16/872,696 filed on May 12, 2020, now U.S. Pat. No. 11,276,738, which claims priority under 35 U.S.C. § 119 to Korean Patent Application No. 10-2019-0055836, filed on May 13, 2019, in the Korean Intellectual Property Office, the disclosures of which are incorporated by reference herein in their entireties.

1. TECHNICAL FIELD

Exemplary embodiments of the inventive concept relate to a display panel, and more particularly, to a display panel having a first area inside a display area and a display apparatus including the display panel.

2. DESCRIPTION OF RELATED ART

A display apparatus is a device for the presentation of information in visual form. Various types of display apparatuses have been introduced with characteristics such as thin, light weight and low power consumption. Accordingly, the range of use of the display apparatuses is becoming widespread.

Various functions for connecting or linking to a display apparatus have been increased while the size of the display area of the display apparatus has increased. In order to add various functions while enlarging the area occupied by the display area, techniques for arranging components in the display area are being studied.

SUMMARY

According to an exemplary embodiment of the inventive concept, there is provided a display panel including: a substrate including a first area, a second area, and a third area between the first area and the second area; a first structure located in the second area and including a pixel electrode, an opposite electrode, an intermediate layer between the pixel electrode and the opposite electrode, and at least one organic material layer; and a plurality of grooves located in the third area and separating the at least one organic material layer and the opposite electrode, wherein a first groove of the plurality of grooves is provided in a multi-layered film including a lower layer and an upper layer, wherein the upper layer includes an inorganic material layer and a first step adjacent to the first groove, the first step having an elevation higher than an upper surface of the lower layer.

The upper layer may include a conductive oxide layer, a metal layer, or an inorganic insulating layer.

The lower layer may include an inorganic insulating film.

The upper layer may include a pair of tips protruding toward a center of the first groove.

A portion of a bottom surface of the upper layer may be separated from the upper surface of the lower layer at each of the tips.

An undercut structure may be between each of the tips and the lower layer, and a width of the undercut structure may be greater than a width of a recess in the lower layer.

The display panel may further include a residual layer in the undercut structure.

The residual layer may include an organic material.

The upper layer may include a first sub-upper layer above the lower layer, and a second sub-upper layer above the first sub-upper layer and including an organic insulating material.

The first sub-upper layer may include an inorganic insulating material.

The display panel may further include: a thin-film transistor between the substrate and a display element; a first organic insulating layer and a second organic insulating layer between the thin-film transistor and the pixel electrode; and a pixel defining film overlapping the pixel electrode.

The second sub-upper layer may include the same material as the first organic insulating layer, the second organic insulating layer, or the pixel defining film.

The thin-film transistor may include a semiconductor layer, a gate electrode partially overlapping the semiconductor layer, and a first electrode electrically connected to the semiconductor layer, and the display panel may further include a connection electrode connecting the first electrode to the pixel electrode.

The first sub-upper layer may include the same material as the first electrode.

The first sub-upper layer may include the same material as the connection electrode.

The display panel may further include a third sub-upper layer between the second sub-upper layer and the first sub-upper layer.

The thin-film transistor may include a semiconductor layer, a gate electrode partially overlapping the semiconductor layer, and a first electrode electrically connected to the semiconductor layer, the display panel may further include a connection electrode connecting the first electrode to the pixel electrode, and the third sub-upper layer includes the same material as the connection electrode.

The third sub-upper layer may include a multilayer structure and an end of the third sub-upper layer facing a center of the first groove is covered by the second organic insulating layer.

The display panel may further include a storage capacitor including a lower electrode including the same material as the gate electrode; and an upper electrode partially overlapping the lower electrode, wherein the first structure further includes: a gate insulating layer between the semiconductor layer and the gate electrode; a first interlayer insulating layer between the lower electrode and the upper electrode; and a second interlayer insulating layer between the upper electrode and the first electrode.

The lower layer may include the same material as the gate insulating layer, the first interlayer insulating layer, or the second interlayer insulating layer.

The lower layer may include a first sub-lower layer including an inorganic insulating material; and a second sub-lower layer including an organic insulating material above the first sub-lower layer.

The first step of the upper layer may be spaced apart from an upper surface of the second sub-lower layer by an encapsulation layer in the first groove.

The display panel may further include: a thin-film transistor between the substrate and a display element; a first organic insulating layer and a second organic insulating layer between the thin-film transistor and the pixel electrode;

and a pixel defining film overlapping the pixel electrode, wherein the second sub-lower layer includes the same material as a first organic insulating layer or a second organic insulating layer.

The display panel may further include a first opening located in the first area and penetrating the display panel.

The display panel may further include a thin-film encapsulation layer located above the first structure and including an inorganic encapsulation layer and an organic encapsulation layer, wherein the inorganic encapsulation layer is continuously arranged along an inner surface of each of the plurality of grooves.

According to an exemplary embodiment of the inventive concept, there is provided a display apparatus including: a display panel including a substrate, the substrate including a first area, a second area, and a third area between the first area and the third area; and an electronic element corresponding to the first area, wherein the display panel further includes a laminated structure located in the second area and including a pixel electrode, an opposite electrode, an intermediate layer between the pixel electrode and the opposite electrode, and at least one organic material layer; and a plurality of grooves located in the third area and cutting the at least one organic material layer and the opposite electrode, wherein at least one of the plurality of grooves is provided in a multi-layered film including a lower layer and an upper layer, and the upper layer includes an inorganic material layer and at least one step.

According to an exemplary embodiment of the inventive concept, there is provided a display apparatus including: a substrate including a first area to accommodate a component, a second area, and a third area between the first area and the second area; an electrode and an organic material layer located in the second area; and a groove located in the third area and between the organic material layer and the electrode, wherein the groove includes a lower layer and an upper layer, wherein the upper layer include an inorganic material layer and a step, the step being elevated above an upper surface of the lower layer.

BRIEF DESCRIPTION OF THE DRAWINGS

The above and other features of the inventive concept will be more apparent by describing in detail exemplary embodiments thereof with reference to the accompanying drawings, in which.

DETAILED DESCRIPTION OF THE EMBODIMENTS

Figure 1:
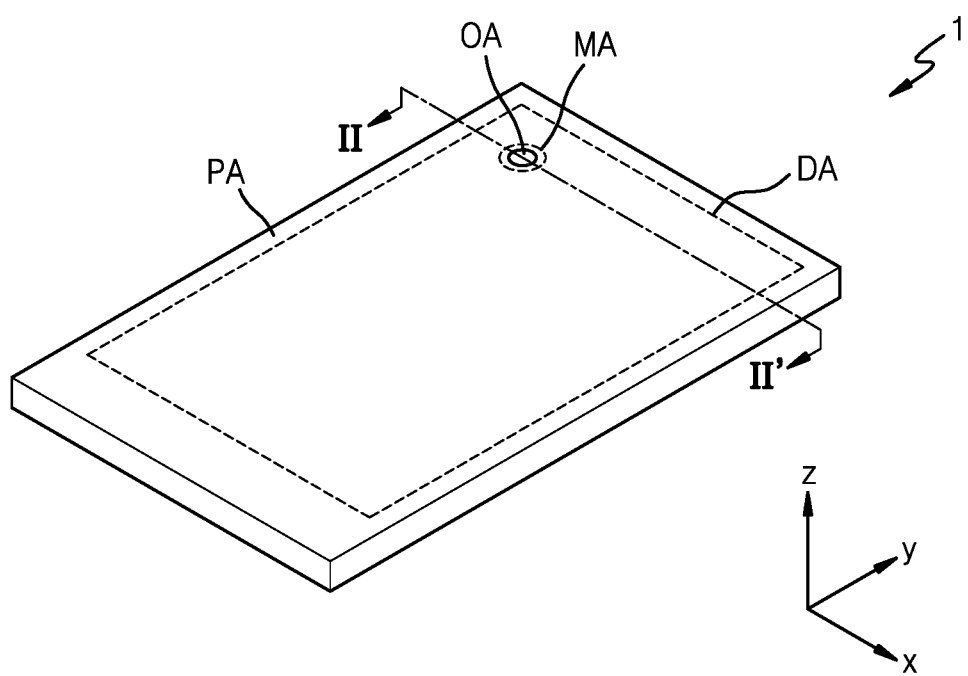
FIG. 1 is a schematic perspective view of a display apparatus according to an exemplary embodiment of the inventive concept.

Exemplary embodiments of the inventive concept will now be described with reference to the accompanying drawings. The inventive concept may, however, be embodied in many different forms and should not be construed as being limited to the embodiments set forth herein.

Like reference numerals in the drawings may denote like elements, and thus, their description may be omitted.

An expression used in the singular encompasses the expression of the plural, unless it has a clearly different meaning in the context.

It will be understood that when a layer, region, or component is referred to as being "formed on" another layer, region, or component, it can be directly formed on the other layer, region, or component, or intervening layers, regions, or components may be present.

Sizes of components in the drawings may be exaggerated for convenience of explanation.

When a certain embodiment may be implemented differently, a specific process order may be performed differently from the described order. For example, two consecutively described processes may be performed substantially at the same time or performed in an order opposite to the described order.

It will be understood that when a layer, region, or component is referred to as being "connected to" another layer, region, or component, it can be directly connected to the other layer, region, or component, or intervening layers, regions, or components may be present. It will be understood that when a layer, region, or component is referred to as being "electrically connected to" another layer, region, or component, it can be directly electrically connected to the other layer, region, or component, or intervening layers, regions, or components may be present.

In the following examples, the x-axis, the y-axis and the z-axis are not limited to three axes of the rectangular coordinate system. For example, the x-axis, the y-axis, and the z-axis may be perpendicular to one another, or may represent different directions that are not perpendicular to one another.

FIG. 1 is a schematic perspective view of a display apparatus 1 according to an exemplary embodiment of the inventive concept.

Figure 2:
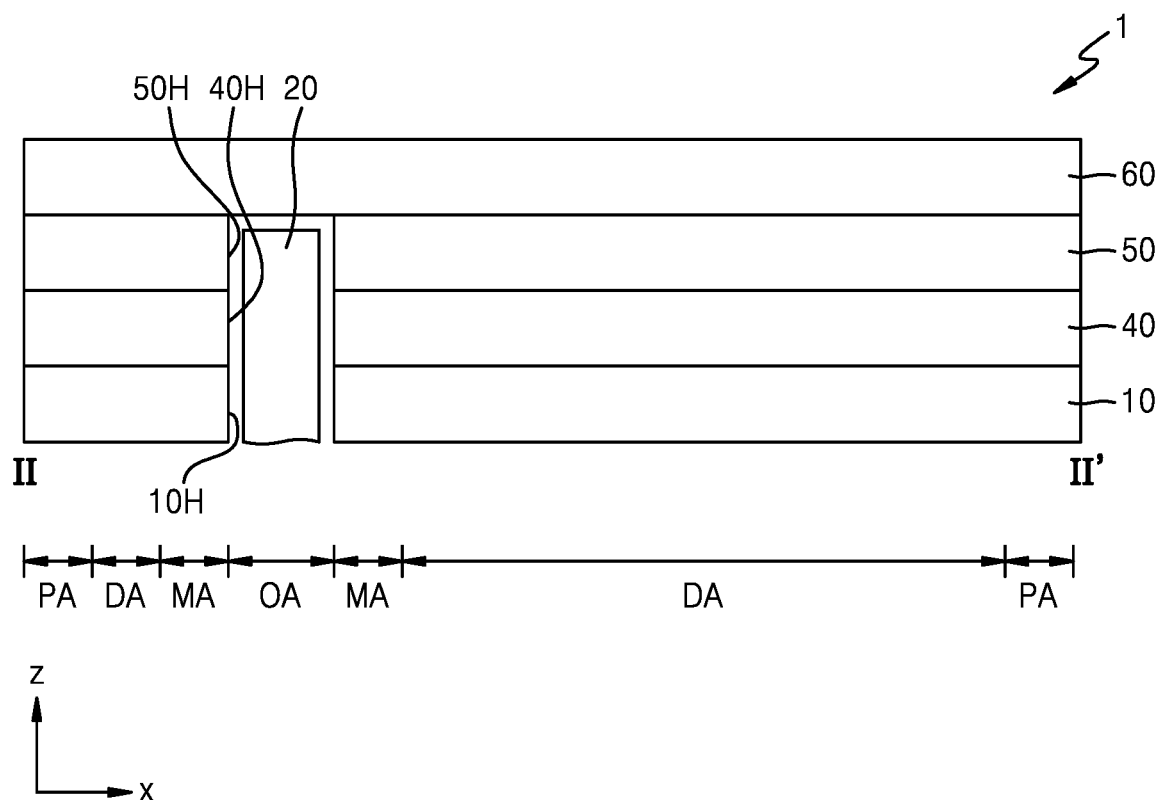
FIGS. 2 and 3 are schematic cross-sectional views of a display apparatus according to an exemplary embodiment of the inventive concept.

Referring to FIG. 1, the display apparatus 1 includes a first area OA and a display area DA at least partially surrounding the first area OA. The display area DA may be referred to as a second area. The display apparatus 1 may display images by using light emitted from a plurality of pixels located in the display area DA. The first area OA may be entirely surrounded by the display area DA. The first area OA may be an area where components to be described below with reference to FIG. 2 are located.

A middle area MA may be located between the first area OA and the display area DA, and the display area DA may be surrounded by a peripheral area PA. The middle area MA may be referred to as a third area and the peripheral area PA may be referred to as a fourth area. The middle area MA and the peripheral area PA may be a non-display area in which pixels are not located. The middle area MA may be entirely surrounded by the display area DA and the display area DA may be entirely surrounded by the peripheral area PA.

Hereinafter, the display apparatus 1 is described as an organic light-emitting display apparatus as an example, but the display apparatus is not limited thereto. In another embodiment, the display apparatus 1 may be a display apparatus such as a quantum dot light-emitting display apparatus.

Although FIG. 1 illustrates that one first area OA is included and the first area OA is substantially circular, the present inventive concept is not limited thereto. The number of the first area OA may be two or more and the shape of each first area OA may be variously changed, such as a circular shape, an oval shape, a polygonal shape, a star shape, a diamond shape, or the like.

Figure 3:
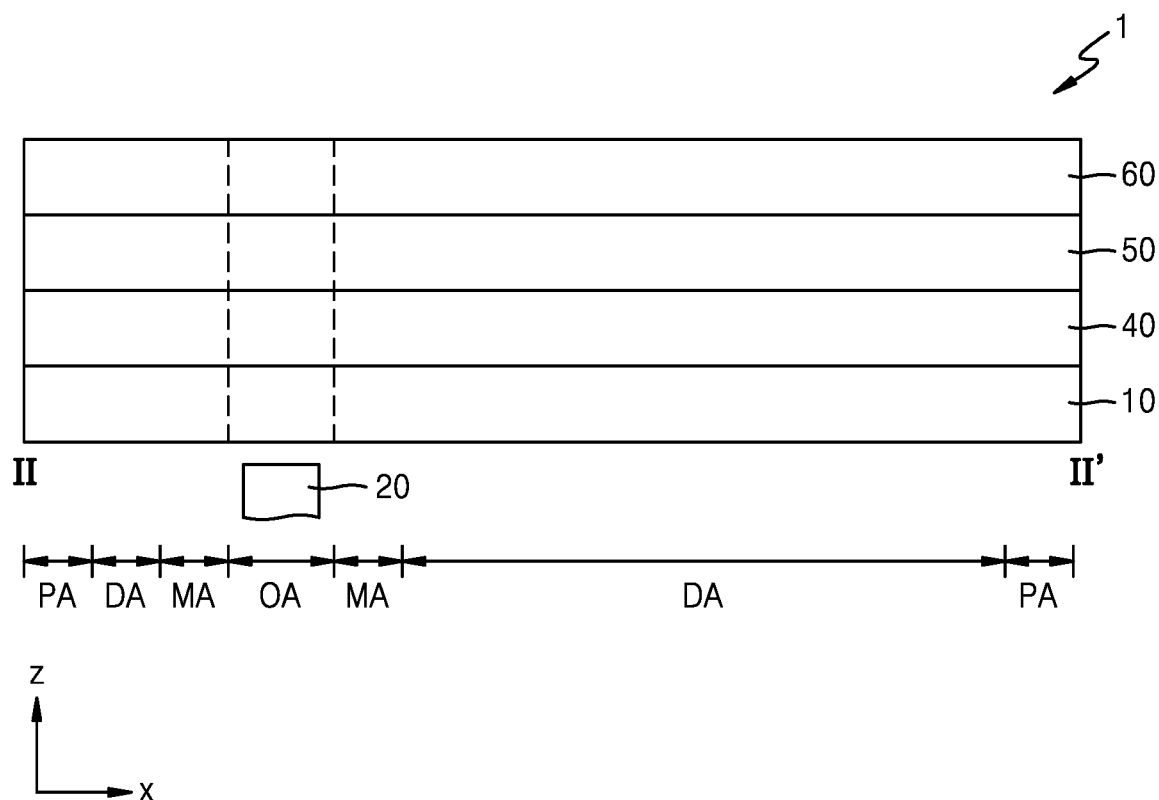

FIGS. 2 and 3 are schematic cross-sectional views of a display apparatus 1 according to an exemplary embodiment of the inventive concept, taken along line II-II' in FIG. 1.

Referring to FIG. 2, the display apparatus 1 may include a display panel 10 and an input sensing layer 40 and an optical functional layer 50 located on the display panel 10. The display panel 10, the input sensing layer 40, and the optical functional layer 50 may be covered by a window 60. The display apparatus 1 may be various types of electronic devices such as a mobile phone, a notebook, or a smart watch.

The display panel 10 may display an image. The display panel 10 includes pixels located in the display area DA. The pixels may include a display element and a pixel circuit connected to the display element. The display element may include an organic light-emitting diode, a quantum dot organic light-emitting diode, or the like.

The input sensing layer 40 may obtain coordinate information according to an external input, for example, a touch event. The input sensing layer 40 may include a sensing electrode (or touch electrode) and a trace line connected to the sensing electrode. The input sensing layer 40 may be located on the display panel 10. The input sensing layer 40 may sense an external input in a mutual-capacitance method and/or a self-capacitance method.

The input sensing layer 40 may be formed directly on the display panel 10 or formed separately and then bonded to the display panel 10 through an adhesive layer such as an optical clear adhesive. For example, the input sensing layer 40 may be formed continuously after a process of forming the display panel 10. In this case, the input sensing layer 40 may be a portion of the display panel 10 and the adhesive layer may not be between the input sensing layer 40 and the display panel 10. FIG. 2 illustrates that the input sensing layer 40 is between the display panel 10 and the optical functional layer 50; however, the input sensing layer 40 may be located above the optical functional layer 50.

The optical functional layer 50 may include an anti-reflection layer. The anti-reflection layer may reduce the reflectance of light incident from the outside (e.g., external light) toward the display panel 10 through the window 60. The anti-reflection layer may include a retarder and a polarizer. The retarder may be a film type or a liquid crystal coating type and may include a $\lambda/2$ retarder and/or a $\lambda/4$ retarder. The polarizer may also be a film type or a liquid crystal coating type. The film type retarder/polarizer may include a stretch-type synthetic resin film, and the liquid crystal coating type retarder/polarizer may include liquid crystals in a certain arrangement. The retarder and the polarizer may further include a protective film. The retarder and the polarizer or the protective film may be a base layer of the anti-reflection layer.

In another exemplary embodiment of the inventive concept, the anti-reflection layer may include a black matrix and color filters. The color filters may be arranged depending on the color of light emitted from each of the pixels of the display panel 10. In another exemplary embodiment of the inventive concept, the anti-reflection layer may include a destructive interference structure. The destructive interference structure may include a first reflective layer and a second reflective layer located on different layers. First reflected light and second reflected light respectively reflected from the first reflective layer and the second reflective layer may destructively interfere, and thus, the reflectance of external light may be reduced.

The optical functional layer 50 may include a lens layer. The lens layer may improve the light output efficiency of the light emitted from the display panel 10 or reduce the color deviation. The lens layer may include a layer having a concave or convex lens shape and/or may include a plurality of layers having different refractive indices. The optical functional layer 50 may include both of the anti-reflection layer and the lens layer or may include one of the anti-reflection layer and the lens layer.

In an exemplary embodiment of the inventive concept, the optical functional layer 50 may be formed continuously after a process of forming the display panel 10 and/or the input sensing layer 40. In this case, the adhesive layer may not be between the optical functional layer 50, the display panel 10, and/or the input sensing layer 40.

The display panel 10, the input sensing layer 40, and/or the optical functional layer 50 may include openings. In this regard, FIG. 2 illustrates that the display panel 10, the input sensing layer 40, and the optical functional layer 50 respectively include first, second and third openings 10H, 40H, and 50H. The first through third openings 10H, 40H, and 50H overlap each other to form on continuous opening in the display panel 10, the input sensing layer 40, and the optical functional layer 50. The first through third openings 10H, 40H, and 50H correspond to the first area OA. In other words, the first through third openings 10H, 40H, and 50H are located in the first area OA. In another exemplary embodiment of the inventive concept, one or more of the display panel 10, the input sensing layer 40, and the optical functional layer 50 may not include an opening. For example, one or two components selected from the display panel 10, the input sensing layer 40, and the optical functional layer 50 may not include an opening. Alternatively, the display panel 10, the input sensing layer 40, and the optical functional layer 50 may not include an opening as shown in FIG. 3.

As described above, the first area OA may be a component area (e.g., a sensor area, a camera area, a speaker area, or the like) where a component 20 configured to add various functions to the display apparatus 1 is located. The component 20 may be located in the first through third openings 10H, 40H, and 50H, as shown in FIG. 2. Alternatively, the component 20 may be below the display panel 10, as shown in FIG. 3.

The component 20 may include an electronic element. For example, the component 20 may be an electronic element that uses light or sound. For example, the electronic element may include a sensor for outputting and/or receiving light, such as an infrared sensor, a camera for capturing an image by receiving light, a sensor for outputting and sensing light or sound to measure a distance or recognize a fingerprint, a small lamp for outputting light, a speaker for outputting sound, or the like. An electronic element using light may use light of various wavelengths such as visible light, infrared light, ultraviolet light, or the like. In an exemplary embodiment of the inventive concept, the first area OA may be a transmission area through which light and/or sound output from the component 20 to the outside or from the outside toward the component 20 may pass.

In another exemplary embodiment of the inventive concept, when the display apparatus 1 is used as a smart watch or an instrument panel for vehicles, the component 20 may be a member such as the hand of a clock or a needle indicating certain information (for example, the speed of a vehicle or the like). When the display apparatus 1 includes the hand of a clock or the instrument panel for vehicles, the component 20 may be exposed to the outside through the window 60, and the window 60 may include an opening corresponding to the first area OA.

The component 20 may include component(s) associated with a function of the display panel 10 as described above or may include components such as accessories that increase aesthetics of the display panel 10. A layer including an optical clear adhesive may be between the window 60 and the optical functional layer 50.

FIGS. 4A to 4D are schematic cross-sectional views of a display panel 10 according to an exemplary embodiment of the inventive concept.

Figure 4A:
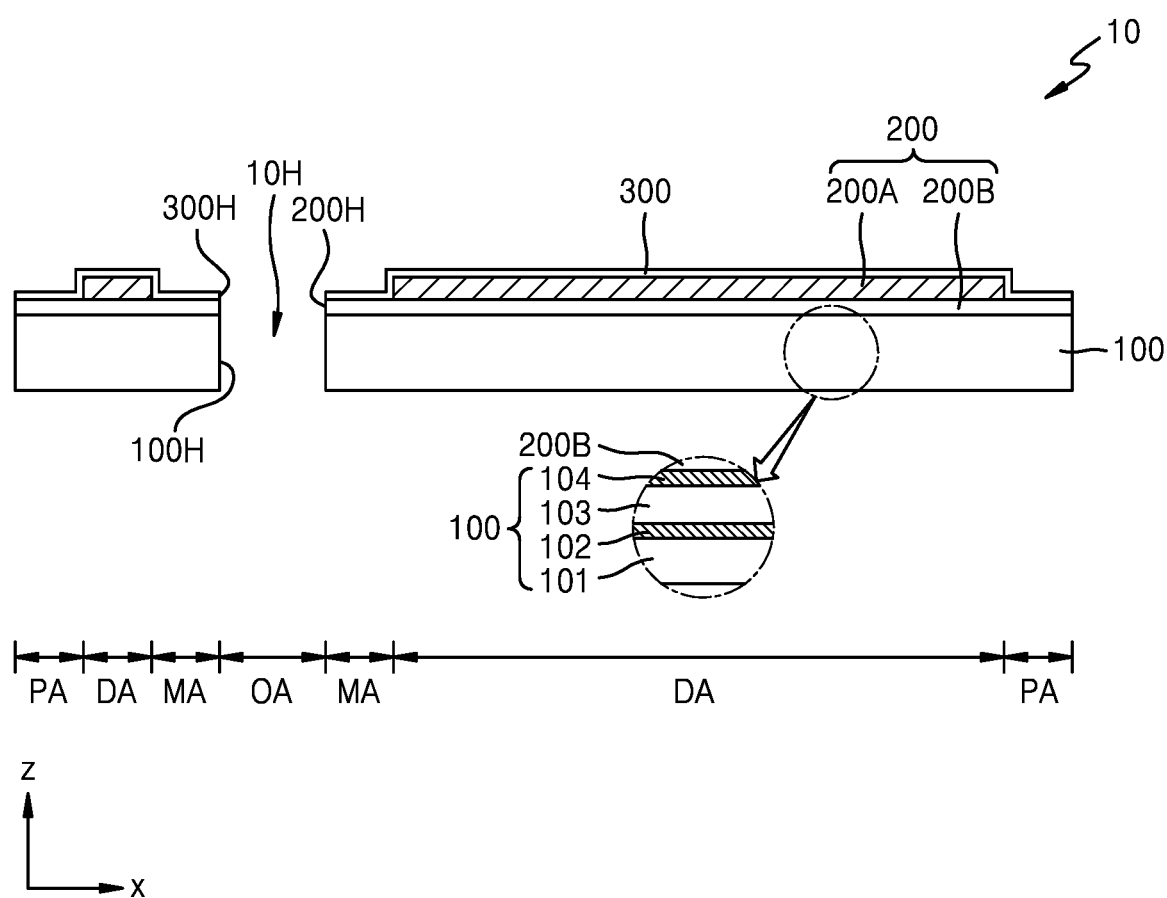
FIGS. 4A, 4B, 4C and 4D are schematic cross-sectional views of a display panel according to an exemplary embodiment of the inventive concept.

Referring to FIG. 4A, the display panel 10 may include a display layer 200 located on a substrate 100. The substrate 100 may include a glass material or a polymer resin. The substrate 100 may be formed in multiple layers. For example, as shown in an enlarged view of FIG. 4A, the substrate 100 may include a first base layer 101, a first barrier layer 102, a second base layer 103, and a second barrier layer 104. The first base layer 101, the first barrier layer 102, the second base layer 103, and the second barrier layer 104 may be sequentially stacked.

Each of the first base layer 101 and the second base layer 103 may include a polymer resin. For example, the first base layer 101 and the second base layer 103 may include a polymer resin such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. The above-mentioned polymer resin may be transparent.

The first barrier layer 102 and the second barrier layer 104 are barrier layers to prevent penetration of external foreign substances. The first barrier layer 102 and the second barrier layer 104 may be a single layer or a multilayer including a material such as silicon nitride ($SiN_x$), silicon oxide ($SiO_x$), or silicon oxynitride ($SiO_xN_y$).

The display layer 200 has a plurality of pixels. The display layer 200 may include a display element layer 200A including display elements located in each pixel and a pixel circuit layer 200B including pixel circuits and insulating layers located in each pixel. The display element layer 200A may have a pixel electrode, an opposite electrode, and a laminated structure between the pixel electrode and the opposite electrode, and each display element may be an organic light-emitting diode (OLED). Each pixel circuit may include a thin-film transistor and a storage capacitor.

The display elements of the display layer 200 may be covered by an encapsulation member such as a thin-film encapsulation layer 300 and the thin-film encapsulation layer 300 may include at least one inorganic encapsulation layer and at least one organic encapsulation layer. When the display panel 10 includes the substrate 100 including a polymer resin and the thin-film encapsulation layer 300 including the inorganic encapsulation layer and the organic encapsulation layer, the flexibility of the display panel 10 may be increased.

The display panel 10 may include a penetration portion 10H penetrating the display panel 10. The penetration portion 10H may be located in the first area OA, and in this case, the first area OA may be an area with an opening. FIG. 4A illustrates that each of the substrate 100 and the thin-film encapsulation layer 300 may include through holes 100H and 300H both corresponding to the penetration portion 10H of the display panel 10. The display layer 200 may also include a through hole 200H corresponding to the first area OA.

Figure 4B:
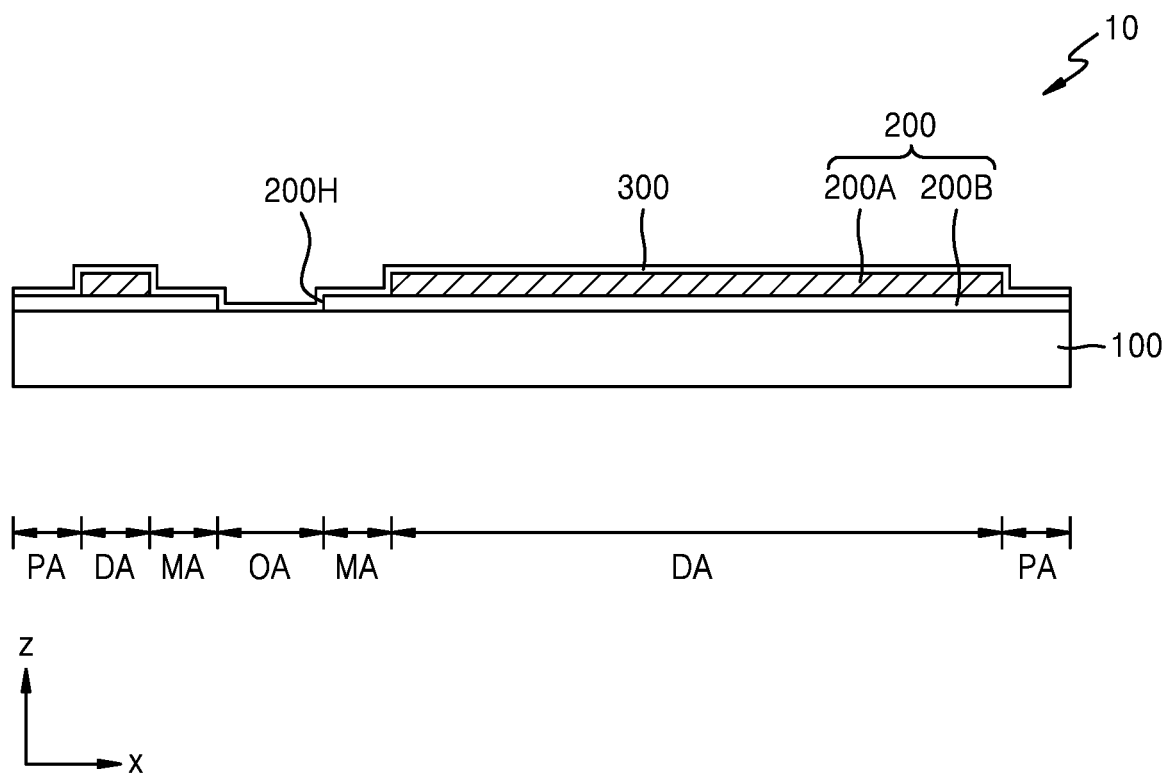

In another exemplary embodiment of the inventive concept, as shown in FIG. 4B, the substrate 100 may not include the through hole corresponding to the first area OA. The display layer 200 may include the through hole 200H corresponding to the first area OA. The thin-film encapsulation layer 300 may not include the through hole corresponding to the first area OA. In another exemplary embodiment of the inventive concept, as shown in FIG. 4C, the display layer 200 may not include the through hole 200H corresponding to the first area OA.

Figure 4C:
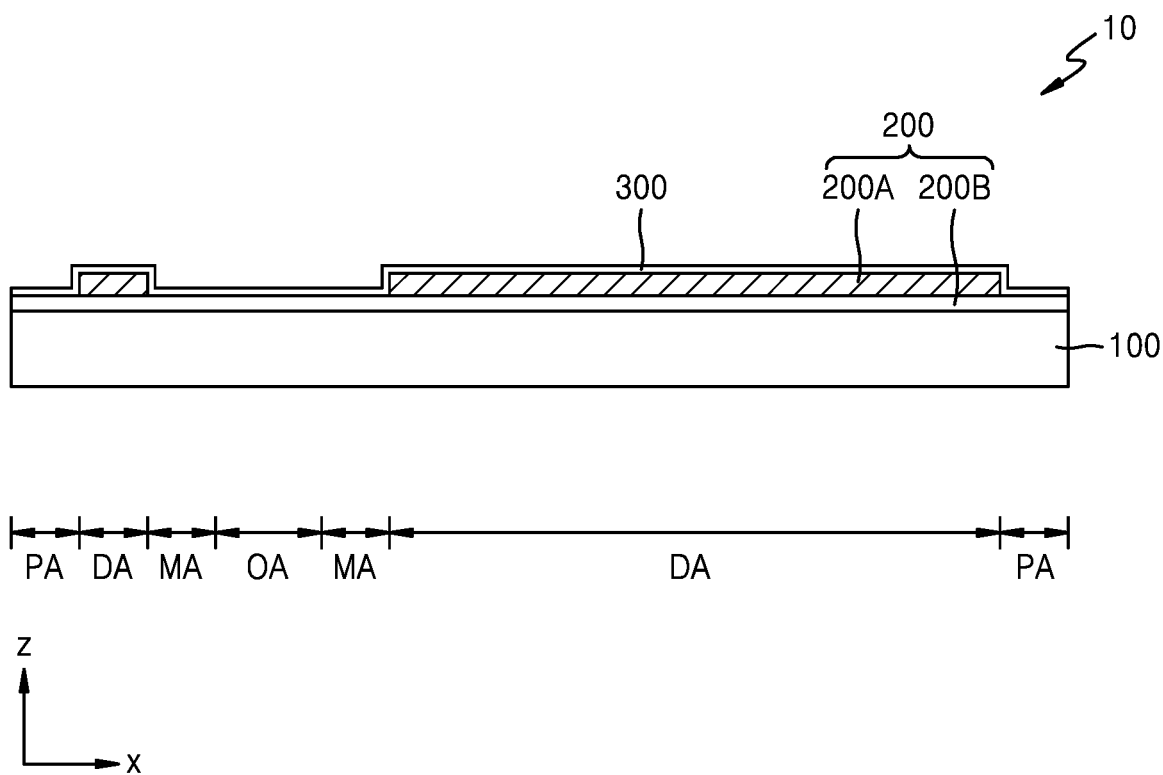
Figure 4D:
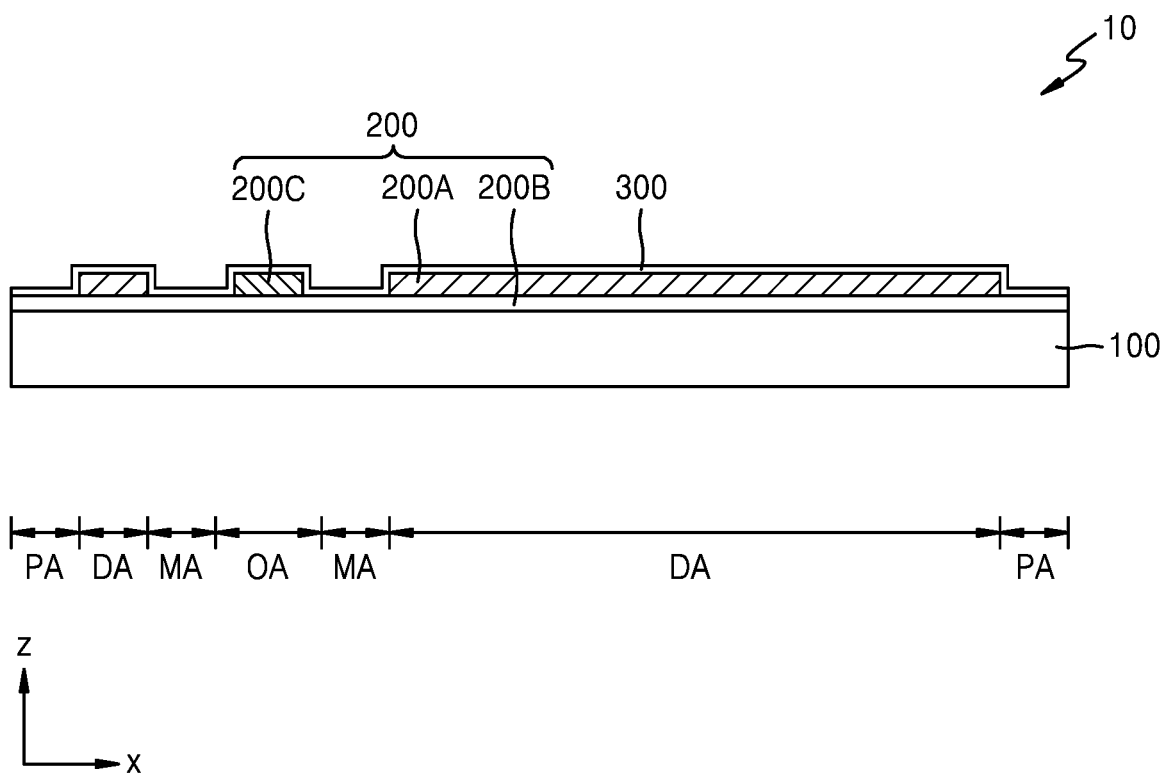

FIGS. 4A to 4C illustrate that the display element layer 200A is not located in the first area OA, but the present inventive concept is not limited thereto. In another exemplary embodiment of the inventive concept, as shown in FIG. 4D, an auxiliary display element layer 200C may be located in the first area OA. The auxiliary display element layer 200C may include a display element which operates in a structure and/or a method different from the display elements of the display element layer 200A.

In an exemplary embodiment of the inventive concept, each of the pixels of the display element layer 200A may include an active OLED and the auxiliary display element layer 200C may include pixels including a passive OLED. When the auxiliary display element layer 200C includes a display element of the passive OLED, components including a pixel circuit may not be present below the passive OLED. For example, a portion of the pixel circuit layer 200B below the auxiliary display element layer 200C does not include a transistor and the storage capacitor.

In another exemplary embodiment of the inventive concept, the auxiliary display element layer 200C may include a display element of the same type as that of the display element layer 200A (for example, the active OLED), but the structure of the pixel circuit of the auxiliary display element layer 200C may be different from that of the display element layer 200A. For example, the pixel circuit below the auxiliary display element layer 200C (for example, a pixel circuit having a light-shielding film between a substrate and a transistor) may include a different structure from the pixel circuit below the display element layer 200A. Alternatively, the display elements of the auxiliary display element layer 200C may operate according to a different control signal from the display elements of the display element layer 200A. A component which does not require a relatively high transmittance (for example, an infrared sensor or the like) may be located in the first area OA in which the auxiliary display element layer 200C is located. In this case, the first area OA may be a component area and an auxiliary display area.

Figure 5:
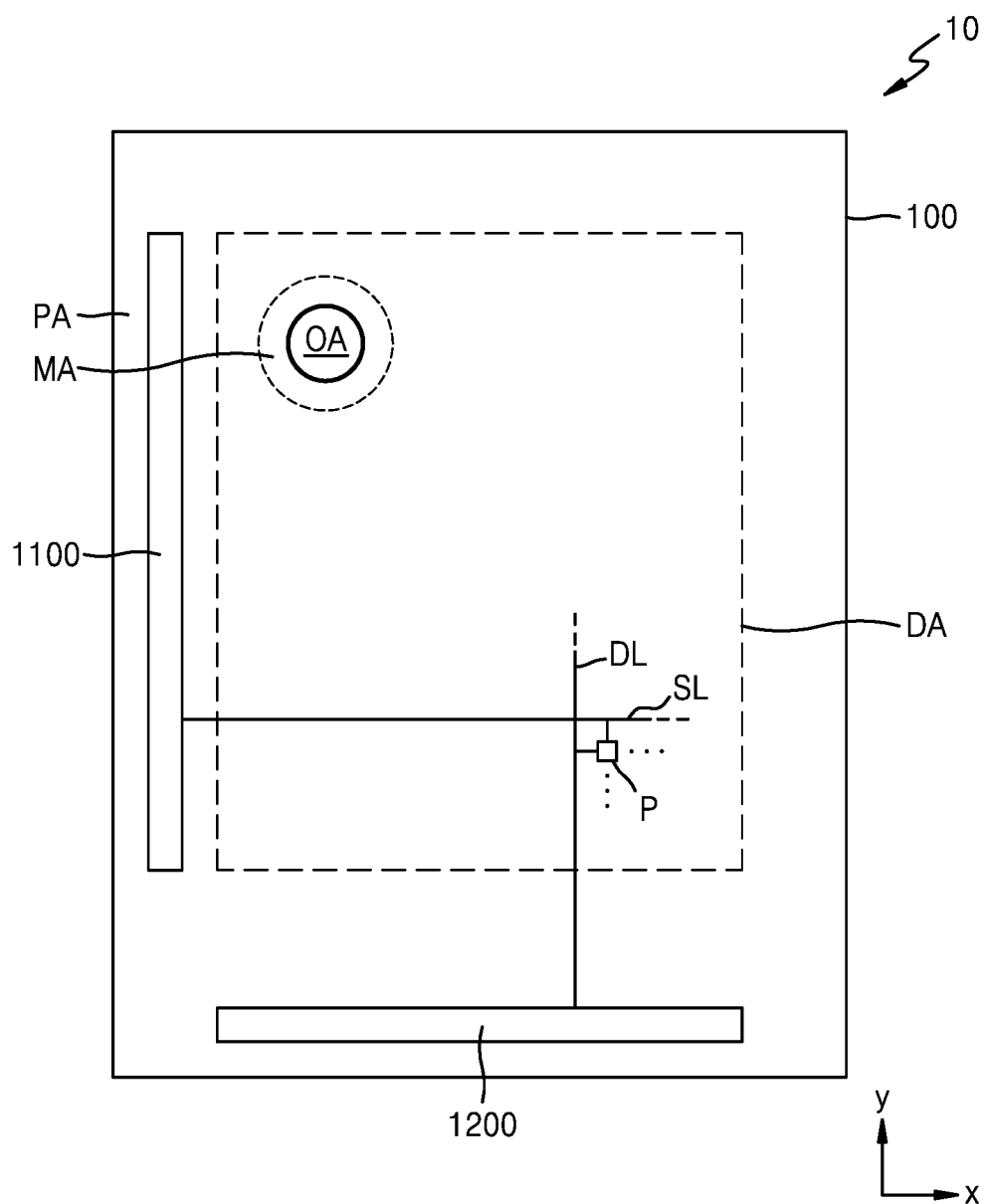
FIG. 5 is a schematic plan view of a display panel according to an exemplary embodiment of the inventive concept.
Figure 6:
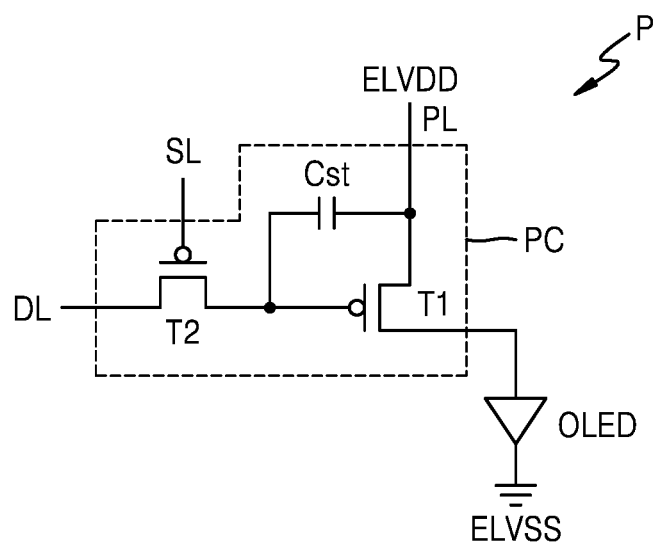
FIG. 6 is an equivalent circuit diagram of a pixel of a display panel according to an exemplary embodiment of the inventive concept.

FIG. 5 is a schematic plan view of the display panel 10 according to an exemplary embodiment of the inventive concept and FIG. 6 is an equivalent circuit diagram of a pixel P of a display panel according to an exemplary embodiment of the inventive concept.

Referring to FIG. 5, the display panel 10 may include the first area OA, the display area DA which is the second area, the middle area MA which is the third area, and the peripheral area PA which is the fourth area. FIG. 5 may be a view of the substrate 100 of the display panel 10. For example, the substrate 100 may have the first area OA, the display area DA, the middle area MA, and the peripheral area PA.

The display panel 10 includes a plurality of pixels P located in the display area DA. As shown in FIG. 6, each pixel P may include a pixel circuit PC and an organic light-emitting diode OLED as a display element connected to the pixel circuit PC. The pixel circuit PC may include a first thin-film transistor T1, a second thin-film transistor T2, and a storage capacitor Cst. Each pixel P may emit, for example, red, green, blue, or white light through the organic light-emitting diode OLED.

The second thin-film transistor T2 is a switching thin-film transistor which may be connected to a scan line SL and a data line DL and deliver, to the first thin-film transistor T1, a data voltage input from the data line DL based on a switching voltage input from the scan line SL. The storage capacitor Cst may be connected to the second thin-film transistor T2 and a driving voltage line PL and store a voltage corresponding to the difference between a voltage received from the second thin-film transistor T2 and a first power supply voltage ELVDD supplied to the driving voltage line PL.

The first thin-film transistor T1 is a driving thin-film transistor which may be connected to the driving voltage line PL and the storage capacitor Cst and control a driving current flowing from the driving voltage line PL through the organic light-emitting diode OLED in accordance with a voltage stored in the storage capacitor Cst. The organic light-emitting diode OLED may emit light having a certain brightness according to the driving current. An opposite electrode (e.g., cathode) of the organic light-emitting diode OLED may receive a second power supply voltage ELVSS.

FIG. 6 illustrates that the pixel circuit PC includes two thin-film transistors and one storage capacitor, but the present inventive concept is not limited thereto. The number of thin-film transistors and the number of storage capacitors may be variously changed according to the design of the pixel circuit PC. For example, the pixel circuit PC may include four or more thin-film transistors in addition to the above-mentioned two thin-film transistors.

Referring to FIG. 5 again, the middle area MA may surround the first area OA in a plan view. The middle area MA is an area in which a display element such as an OLED is not located, and signal lines for providing signals to the pixels P located around the first area OA may pass by the middle area MA. A scan driver 1100 providing a scan signal to each pixel P, a data driver 1200 providing a data signal to each pixel P, a main power-supply wiring to provide a first power-supply voltage and a second power-supply voltage, or the like may be located in the peripheral area PA. FIG. 5 illustrates that the data driver 1200 is located adjacent to one side of the substrate 100, but according to another exemplary embodiment of the inventive concept, the data driver 1200 may be located on a flexible printed circuit board (FPCB) electrically connected to a pad located on one side of the display panel 10.

Figure 7:
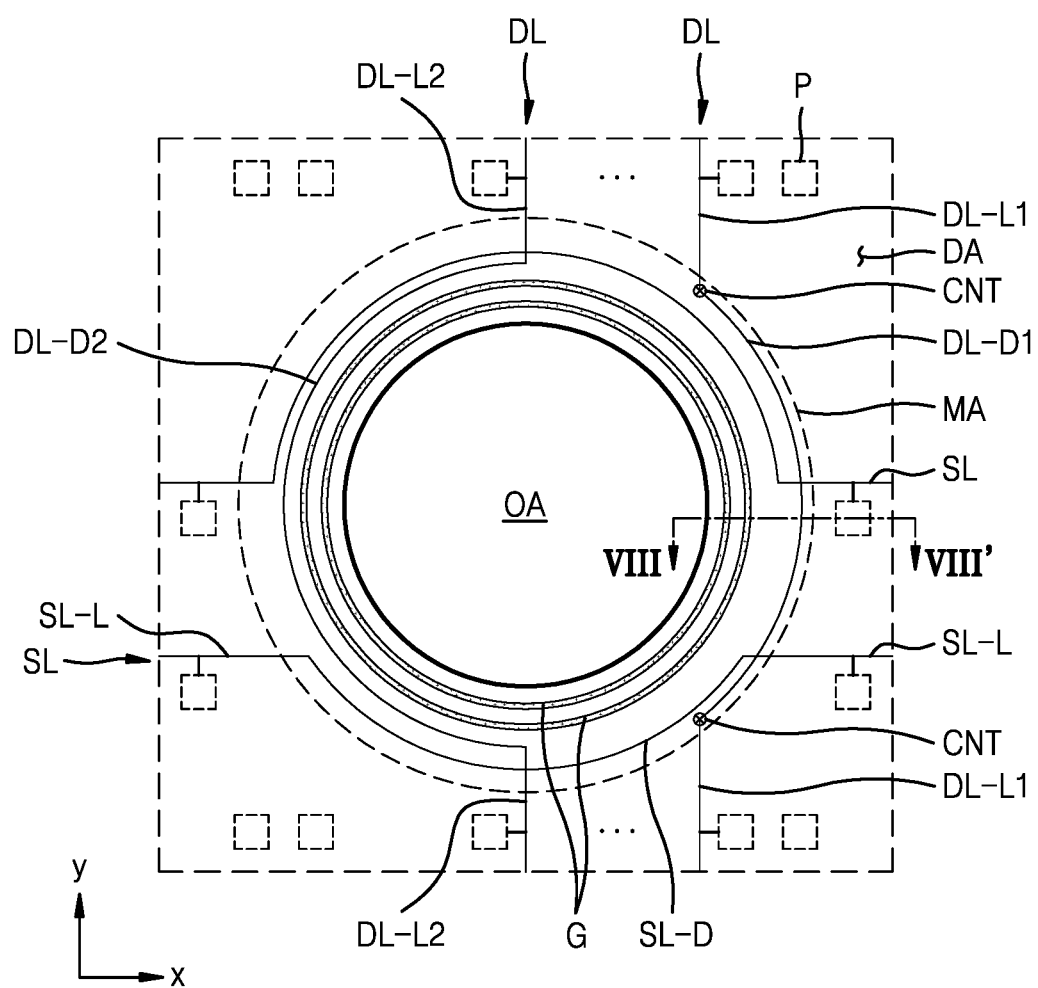
FIG. 7 is a plan view of a portion of a display panel according to an exemplary embodiment of the inventive concept.

FIG. 7 is a plan view of a portion of a display panel according to an exemplary embodiment of the inventive concept.

Referring to FIG. 7, the pixels P are located in the display area DA around the first area OA. Some of the pixels P may be apart from each other around the first area OA and the first area OA may be between the pixels P. For example, in a plan view, the pixels P may be respectively located above and below the first area OA, and the pixels P may be located on the left and right of the first area OA.

Signal lines adjacent to the first area OA among signal lines supplying signals to the pixels P may bypass the first area OA. In other words, the signal lines may go around the first area OA. In the plan view of FIG. 7, at least one data line DL among data lines passing by the display area DA may extend in a y-direction to provide a data signal to the pixels P respectively located above and below the first area OA and may bypass an edge of the first area OA in the middle area MA. In a plan view, at least one scan line SL among scan lines passing by the display area DA may extend in an x-direction to provide a scan signal to the pixels P respectively located on the left and right of the first area OA and may bypass the edge of the first area OA in the middle area MA.

A bypass portion SL-D of the scan line SL may be located on the same layer as an extending portion SL-L of the scan line SL crossing the display area DA and may be integrally formed with the extending portion SL-L. A bypass portion DL-D1 of a first data line DL among the data lines DL may be formed on a different layer from an extending portion DL-L1 of the first data line DL crossing the display area DA, and the bypass portion DL-D1 and the extending portion DL-L1 of the first data line DL may be connected through a contact hole CNT. A bypass portion DL-D2 of a second data line DL among the data lines may be located on the same layer as an extending portion DL-L2 of the second data line DL and may be integrally formed with the extending portion DL-L2.

One or more grooves G may be between the first area OA and an area where the scan line SL and the data line DL in the middle area MA bypass the first area OA. In a plan view, each of the grooves G may have a ring shape surrounding the first area OA, and the grooves G may be apart from each other.

Figure 8:
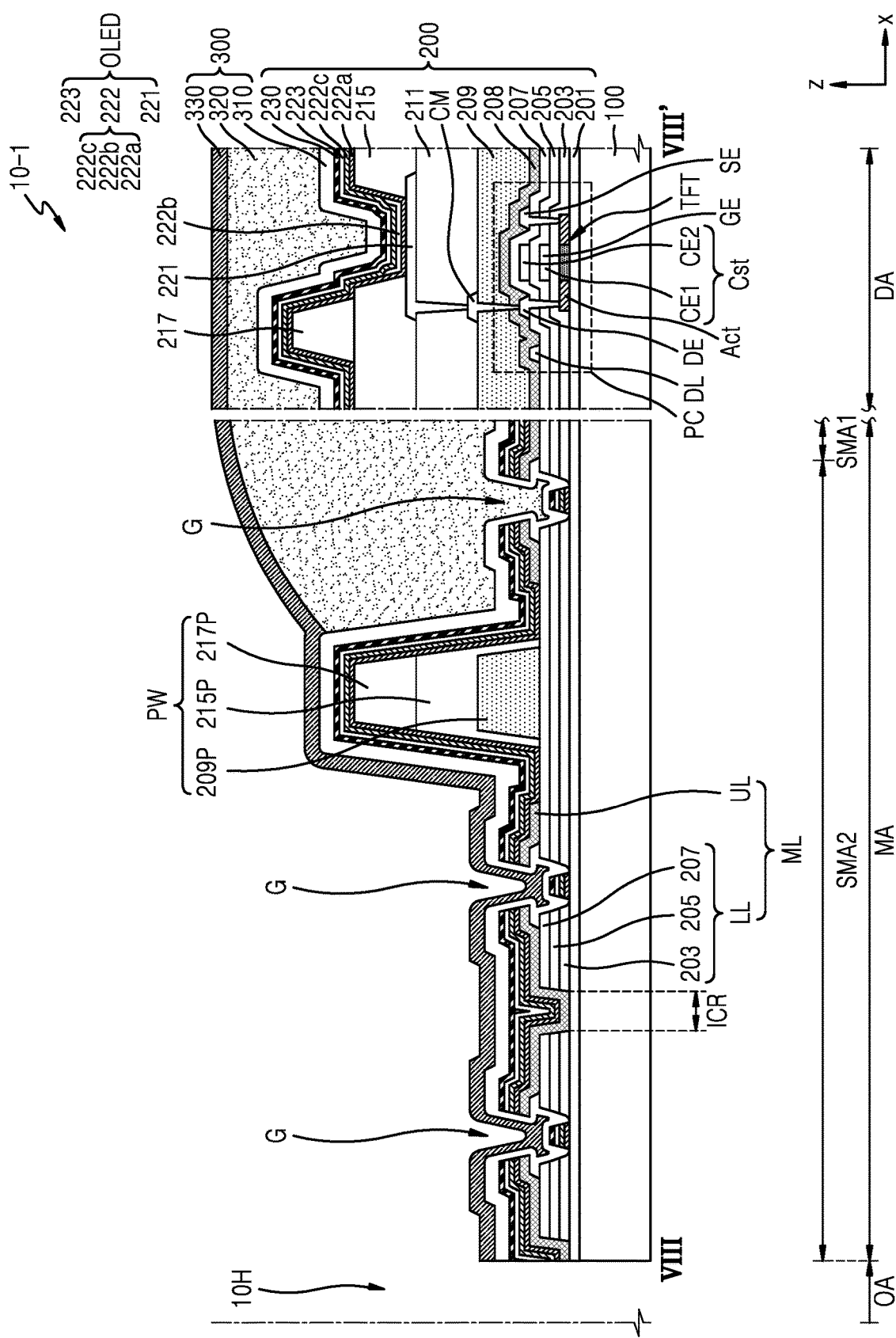
FIG. 8 is a cross-sectional view of a display panel according to an exemplary embodiment of the inventive concept.
Figure 9:
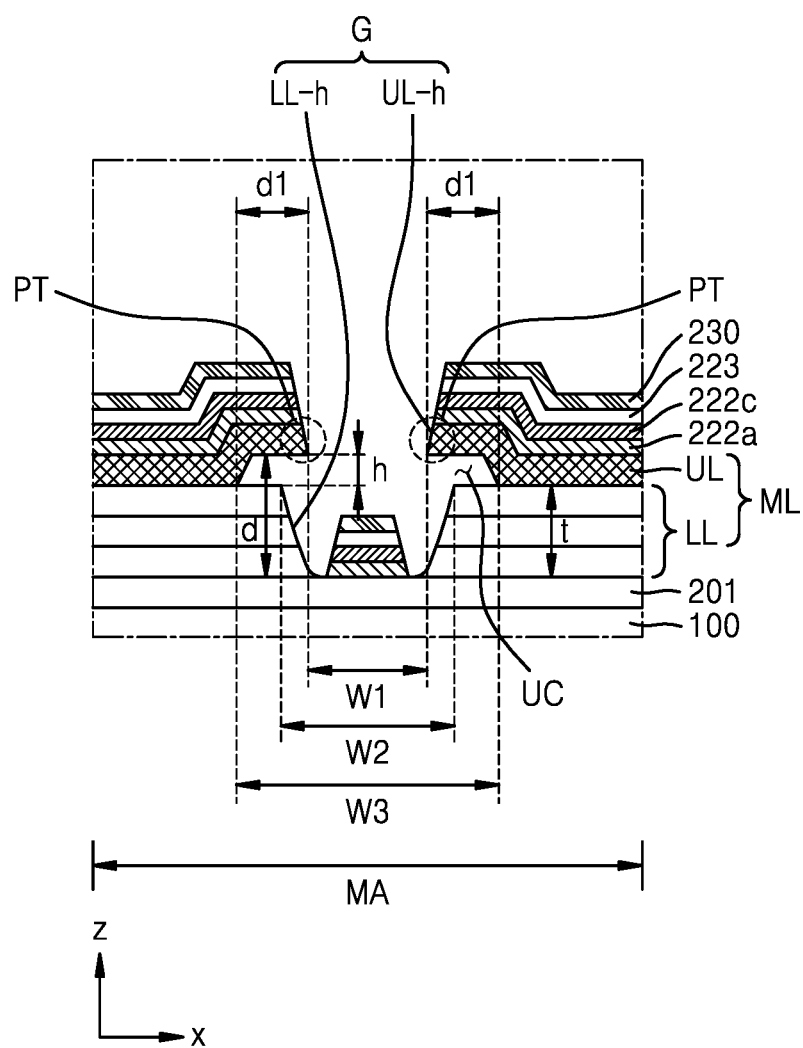
FIG. 9 is a schematic cross-sectional view of an enlarged portion of the display panel of FIG. 8 according to an exemplary embodiment of the inventive concept.

FIG. 8 is a cross-sectional view of a display panel 10-1 according to an exemplary embodiment of the inventive concept and FIG. 9 is an enlarged view of a portion of the display panel 10-1 of FIG. 8. FIG. 8 may correspond to a cross-section taken along line VIII-VIII' in FIG. 7.

Referring to the display area DA of the display panel 10-1 in FIG. 8, the substrate 100 may include a glass material or a polymer resin. In an exemplary embodiment of the inventive concept, the substrate 100 may include a plurality of layers as shown in an enlarged view in FIG. 4A.

A buffer layer 201 may be formed on the substrate 100 to prevent impurities from penetrating into a semiconductor layer Act of a thin-film transistor TFT. The buffer layer 201 may include an inorganic insulating material such as silicon nitride, silicon oxynitride, and silicon oxide, and may be a single layer or a multilayer including the above-described inorganic insulating material.

The pixel circuit PC may be located on the buffer layer 201. The pixel circuit PC may include the thin-film transistor TFT and a storage capacitor Cst. The thin-film transistor TFT may include the semiconductor layer Act, a gate electrode GE, and a source electrode SE and a drain electrode DE which are connection electrodes (e.g., a first electrode). The thin-film transistor TFT shown in FIG. 8 may correspond to the driving thin-film transistor described with reference to FIG. 6. The data line DL of the pixel circuit PC is electrically connected to a switching thin-film transistor included in the pixel circuit PC. In the present embodiment, a top-gate type in which the gate electrode GE is above the semiconductor layer Act with a gate insulating layer 203 between the gate electrode GE and the semiconductor layer Act is shown, but according to another exemplary embodiment of the inventive concept, the thin-film transistor TFT may be a bottom-gate type.

The semiconductor layer Act may include polysilicon. Alternatively, the semiconductor layer Act may include an amorphous silicon, an oxide semiconductor, an organic semiconductor, or the like. The gate electrode GE may include a low-resistance metal material. The gate electrode GE may include a conductive material including molybdenum (Mo), aluminum (Al), copper (Cu), titanium (Ti), or the like and may be a multilayer or a single layer including the above-mentioned material.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, hafnium oxide, or the like. The gate insulating layer 203 may be a single layer or a multilayer including the above-mentioned material.

The source electrode SE and the drain electrode DE which are connection electrodes electrically connected to the semiconductor layer Act may be located on the same layer as the data line DL and may include the same material as the data line DL. The source electrode SE, the drain electrode DE, and the data line DL may include a material with good conductivity. The source electrode SE and the drain electrode DE may include a conductive material including Mo, Al, Cu, Ti, or the like and may be a multilayer or a single layer including the above-mentioned material. In an exemplary embodiment of the inventive concept, the source electrode SE, the drain electrode DE, and the data line DL may be formed as a multilayer of Ti/Al/Ti.

The storage capacitor Cst may include a lower electrode CE1 and an upper electrode CE2 which overlap each other and a first interlayer insulating layer 205 may be between the lower electrode CE1 and the lower electrode CE2. The storage capacitor Cst may overlap the thin-film transistor TFT. FIG. 8 illustrates that the gate electrode GE of the thin-film transistor TFT is the lower electrode CE1 of the storage capacitor Cst. In another exemplary embodiment of the inventive concept, the storage capacitor Cst may not overlap the thin-film transistor TFT. The storage capacitor Cst may be covered by a second interlayer insulating layer 207. The upper electrode CE2 of the storage capacitor Cst may include a conductive material including Mo, Al, Cu, Ti, or the like and may be a multilayer or a single layer including the above-mentioned material.

The first interlayer insulating layer 205 and the second interlayer insulating layer 207 may include an inorganic insulating material such as silicon oxide, silicon nitride, silicon oxynitride, aluminum oxide, titanium oxide, tantalum oxide, hafnium oxide, or the like. The first interlayer insulating layer 205 and the second interlayer insulating layer 207 may be a single layer or a multilayer including the above-mentioned material.

The pixel circuit PC including the thin-film transistor TFT and the storage capacitor Cst may be covered by an inorganic insulating layer 208. The inorganic insulating layer 208 may prevent a wire including a metal, which may be damaged by an etchant such as aluminum, from being exposed to an etching environment in a manufacturing process of a display apparatus. The inorganic insulating layer 208 may extend to the middle area MA.

The inorganic insulating layer 208 may include an inorganic material such as silicon oxide, silicon nitride and/or silicon oxynitride and may be formed as a single layer or a multilayer. In an exemplary embodiment of the inventive concept, the inorganic insulating layer 208 may include $SiN_x$. The inorganic insulating layer 208 may have a thickness of about 500 Å or more. In another exemplary embodiment of the inventive concept, the thickness of the inorganic insulating layer 208 may be 1000 Å or more, 1500 Å or more, 2000 Å or more, 2500 Å or more, 3000 Å or more, 3500 Å or more, 4000 Å or more, 4500 Å or more, 5000 Å or more, 5500 Å or more, 6000 Å or more, or 6500 Å or more. In addition, the inorganic insulating layer 208 may have a thickness of 7000 Å to 10000 Å.

A first organic insulating layer 209 may be located on the inorganic insulating layer 208. An upper surface of the first organic insulating layer 209 may be substantially flat.

The pixel circuit PC may be electrically connected to the pixel electrode 221. For example, as shown in FIG. 8, a contact metal layer CM (e.g., a connection electrode) may be between the thin-film transistor TFT and the pixel electrode 221. The contact metal layer CM may be in contact with the thin-film transistor TFT through a contact hole formed in the first organic insulating layer 209 and the pixel electrode 221 may be in contact with the contact metal layer CM through a contact hole formed in a second organic insulating layer 211 above the contact metal layer CM. The contact metal layer CM may include a conductive material including Mo, Al, Cu, Ti, or the like and may be a multilayer or a single layer including the above-mentioned material. In an exemplary embodiment of the inventive concept, the contact metal layer CM may be formed as a multilayer of Ti/Al/Ti.

The first organic insulating layer 209 and the second organic insulating layer 211 may include a polymer such as poly(methyl methacrylate) (PMMA) or polystyrene (PS), a polymer derivative having a phenol group, and an organic insulating material such as an acrylic polymer, an imide polymer, an aryl ether polymer, an amide polymer, a fluorine polymer, a p-xylene polymer, a vinyl alcohol polymer, and a blend thereof. In an exemplary embodiment of the inventive concept, the first organic insulating layer 209 and the second organic insulating layer 211 may include polyimide.

The pixel electrode 221 may be formed above the second organic insulating layer 211. The pixel electrode 221 may include a conductive oxide such as an indium tin oxide (ITO), an indium zinc oxide (IZO), a zinc oxide (ZnO), an indium oxide ($In_2O_3$), an indium gallium oxide (IGO), or an aluminum zinc oxide (AZO). In another exemplary embodiment of the inventive concept, the pixel electrode 221 may include a reflective film, the reflective film including silver (Ag), magnesium (Mg), aluminum (Al), platinum (Pt), palladium (Pd), gold (Au), nickel (Ni), neodymium (Nd), iridium (Ir), chromium (Cr) or a compound thereof. In another exemplary embodiment of the inventive concept, the pixel electrode 221 may further include a film including ITO, IZO, ZnO, or $In_2O_3$ above/below the reflective film mentioned above.

A pixel defining film 215 may be formed on the pixel electrode 221. The pixel defining film 215 may include an opening exposing an upper surface of the pixel electrode 221 and may cover the edge of pixel electrode 221. The pixel defining film 215 may include an organic insulating material. In addition, the pixel defining film 215 may include an inorganic material such as $SiN_x$, SiON, or $SiO_x$. In addition, the pixel defining film 215 may include an organic insulating material and an inorganic insulating material.

An intermediate layer 222 may include a light-emitting layer 222b. The intermediate layer 222 may include a first functional layer 222a located below the light-emitting layer 222b and/or a second functional layer 222c located on the light-emitting layer 222b. The light-emitting layer 222b may include a high-molecular-weight or low-molecular-weight organic material which emits light of a certain color.

The first functional layer 222a may be a single layer or a multilayer. For example, when the first functional layer 222a includes a high-molecular-weight material, the first functional layer 222a may be a hole transport layer (HTL) having a single-layer structure and may include poly-(3,4)-ethylene-dihydroxy thiophene (PEDOT) or polyaniline (PANI). When the first functional layer 222a includes a low-molecular-weight material, the first functional layer 222a may include a hole injection layer (HIL) and an HTL.

The second functional layer 222c is not always provided. For example, when the first functional layer 222a and the light-emitting layer 222b include a high-molecular-weight material, the second functional layer 222c is formed. The second functional layer 222c may be a single layer or a multilayer. The second functional layer 222c may include an electron transport layer (ETL) and/or an electron injection layer (EIL).

The light-emitting layer 222b of the intermediate layer 222 may be provided for each pixel in the display area DA. The light-emitting layer 222b may be patterned to correspond to the pixel electrode 221. Unlike the light-emitting layer 222b, the first functional layer 222a and/or the second functional layer 222c may exist not only in the display area DA but also in the middle area MA.

An opposite electrode 223 may include a conductive material having a low work function. For example, the opposite electrode 223 may include a (semi)transparent layer, the (semi)transparent layer including Mg, Al, Pt, Pd, Au, Ni, Nd, Ir, Cr, lithium (Li), calcium (Ca), alloys thereof, or the like. The opposite electrode 223 may further include a layer such as ITO, IZO, ZnO, or $In_2O_3$ above the (semi)transparent layer including the above-mentioned material. The opposite electrode 223 may be formed not only above the display area DA but also above the middle area MA. The first functional layer 222a, the second functional layer 222c and the opposite electrode 223 may be formed by thermal deposition.

A capping layer 230 may be located on the opposite electrode 223. For example, the capping layer 230 may include lithium fluoride (LiF) and may be formed by thermal deposition. In an exemplary embodiment of the inventive concept, the capping layer 230 may be omitted.

A spacer 217 may be formed on the pixel defining film 215. For example, the spacer 217 may be formed on a side of the pixel defining film 215 overlapping the contact metal layer CM. The spacer 217 may include an organic insulating material such as polyimide. In addition, the spacer 217 may include an inorganic insulating material, an organic insulating material, and an inorganic insulating material.

The spacer 217 may include a material different from that of the pixel defining film 215 or may include the same material as that of the pixel defining film 215. For example, the pixel defining film 215 and the spacer 217 may be formed together in a mask process using a halftone mask. In an exemplary embodiment of the inventive concept, the pixel defining film 215 and the spacer 217 may include polyimide.

The organic light-emitting diode OLED may be covered by the thin-film encapsulation layer 300. The thin-film encapsulation layer 300 may include at least one organic encapsulation layer and at least one inorganic encapsulation layer. For example, FIG. 8 illustrates that the thin-film encapsulation layer 300 includes first and second inorganic encapsulation layers 310 and 330 and an organic encapsulation layer 320 between the first and second inorganic encapsulation layer 310 and 330. In another exemplary embodiment of the inventive concept, the number of organic encapsulation layers, the number of inorganic encapsulation layers, and the order of lamination may be changed. For example, the organic encapsulation layer 320 may be disposed below the first and second inorganic encapsulation layers 310 and 330.

The first inorganic encapsulation layer 310 and the second inorganic encapsulation layer 330 may each include one or more inorganic materials such as aluminum oxide, titanium oxide, tantalum oxide, hafnium oxide, zinc oxide, silicon oxide, silicon nitride, silicon oxynitride. The first inorganic encapsulation layer 310 and the second inorganic encapsulation layer 330 may be a single layer or a multilayer including the above-mentioned material.

The organic encapsulation layer 320 may include a polymer-based material. The polymer-based material may include an acrylic resin, an epoxy resin, polyimide, and polyethylene. In an exemplary embodiment of the inventive concept, the organic encapsulation layer 320 may include acrylate.

The thickness of the first inorganic encapsulation layer 310 and the thickness of the second inorganic encapsulation layer 330 may be different from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310 or the thickness of the first inorganic encapsulation layer 310 and the second inorganic encapsulation layer 330 may have the same thickness.

Referring to the middle area MA of FIG. 8, the middle area MA may include a first sub-middle area SMA1 relatively far away from the first area OA and a second sub-middle area SMA2 relatively close to the first area OA. The second sub-middle area SMA2 is disposed between the first area OA and the first sub-middle area SMA1. Lines and grooves G bypassing the first area OA may be located in the middle area MA.

Lines, for example, the data lines DL located in the display area DA as shown in FIG. 8 may also be located in the first sub-middle area SMA1 as shown in FIG. 7. The data lines DL located in the first sub-middle area SMA1 may correspond to bypass portions (for example, DL-D1 and DL-D2) of the data lines DL described with reference to FIG. 7. The first sub-middle area SMA1 may be a line area or a bypass area in which lines such as the above-mentioned data lines DL bypass.

In another exemplary embodiment of the inventive concept, the data lines DL may be alternately arranged with an insulating layer between the data lines DL. For example, neighboring data lines DL may be alternately arranged such that one of the neighboring data lines DL is located below an insulating layer (e.g., the first organic insulating layer 209) and another one of the neighboring data lines DL is located above the insulating layer (e.g., the first organic insulating layer 209). When the data lines DL are alternately arranged with the insulating layer between the data lines DL, a distance (e.g., Δd, pitch) between the data lines DL may be reduced. Although FIG. 8 illustrates the data line DL located in the display area DA, the scan lines SL described with reference to FIG. 7, for example, bypass portions of the scan lines SL may be located in the first sub-middle area SMA1.

A partition PW and grooves G may be located in the second sub-middle area SMA2 of the middle area MA.

The partition PW may be between neighboring grooves G. The partition PW may be formed by sequentially stacking a portion 209P of a layer forming the first organic insulating layer 209, a portion 215P of a layer forming the pixel defining film 215, and a portion 217P of a layer forming the spacer 217. The height from the upper surface of the substrate 100 to an upper surface of the partition PW may be lower than the height from the upper surface of the substrate 100 to an upper surface of the spacer 217. In other words, the top of the partition PW may be disposed lower than the top of the spacer 217.

The middle area MA may include an inorganic contact region ICR. The inorganic contact region ICT may be between the neighboring grooves G. The inorganic contact region ICR is a direct contact region of layers including an inorganic material. For example, FIG. 8 illustrates that an inorganic layer, in other words, an upper layer UL is in direct contact with the buffer layer 201 in the inorganic contact region ICR. The upper layer UL may be in contact with the buffer layer 201 through openings forming in each of the gate insulating layer 203, the first interlayer insulating layer 205, and the second interlayer insulating layer 207.

One or more grooves G may be located in the second sub-middle area SMA2. Organic material layers included in the intermediate layer 222, for example, the first functional layer 222a and/or the second functional layer 222c may be cut off (e.g., separated) by the groove G. The second sub-middle area SMA2 may be a groove region or a cut-off region (or a separation region) of organic material layers.

The grooves G may be formed before a process of forming the intermediate layer 222; thus, the first functional layer 222a, the second functional layer 222c, the opposite electrode 223, and the capping layer 230 may be cut off or separated by the grooves G, as shown in FIGS. 8 and 9.

The groove G may be formed in a multi-layered film ML between the substrate 100 and the pixel electrode 221. As shown in FIG. 8 with respect to the partition PW, the groove G may include at least one or more grooves between the partition PW and the display area DA and between the partition PW and the first area OA.

The multi-layered film ML may include a laminated structure of a lower layer LL and the upper layer UL. Accordingly, the lower layer LL and the upper layer UP may each include a single layer or a plurality of layers. The lower layer LL may include at least one inorganic insulating film and the upper layer UL may include at least one of a conductive oxide layer, a metal layer, and an inorganic insulating layer.

The lower layer LL may include at least one inorganic insulating film and may include a plurality of inorganic insulating films 203, 205, and 207 as shown in FIG. 8. The plurality of inorganic insulating films may each include the same material as the gate insulating layer 203, the first interlayer insulating layer 205, and the second interlayer insulating layer 207 in the display area DA.

The upper layer UL may be located above the lower layer LL. The upper layer UL may include an inorganic material. For example, the inorganic material of the upper layer UL may include a conductive oxide such as IZO, ITO, ZnO, $In_2O_3$, IGO, and/or AZO. In addition, the inorganic material may include a metal such as Mo, Al, Cu, and/or Ti. Furthermore, the inorganic material may include an insulating material such as silicon nitride, silicon oxide, and/or silicon oxynitride.

Figure 17:
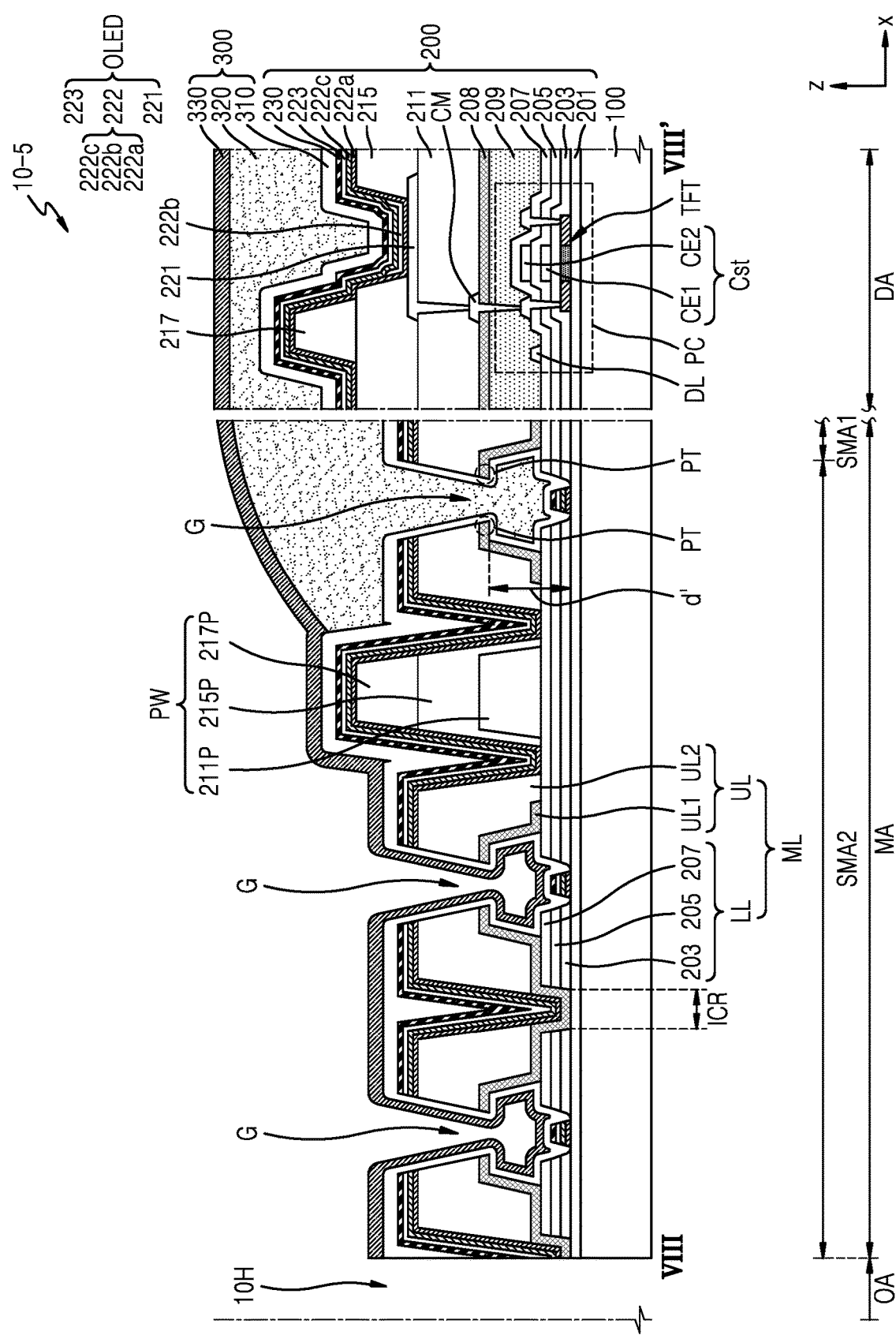
Figure 18:
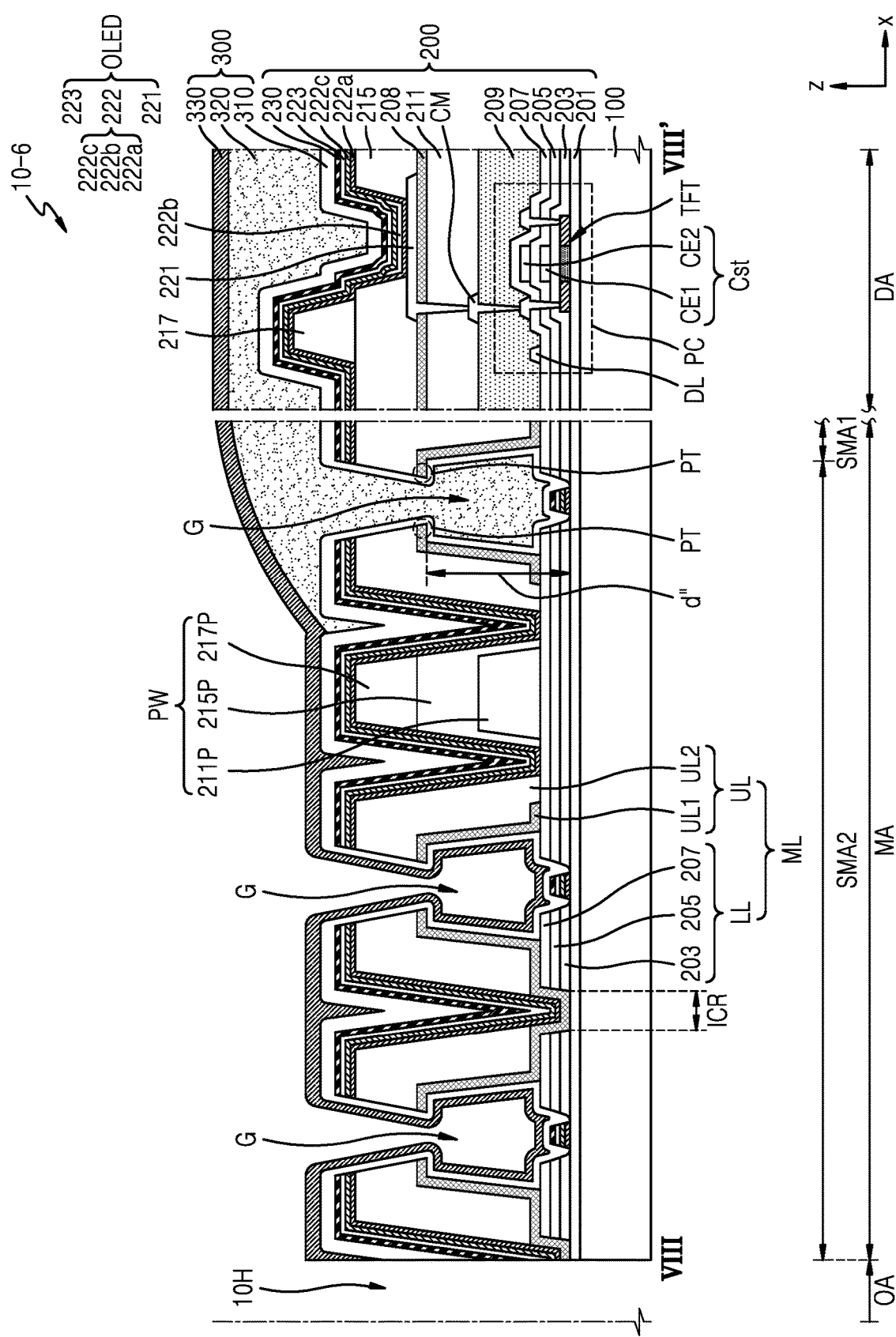

Although FIG. 8 illustrates that the upper layer UL includes the same material as the inorganic insulating layer 208 in the display area DA, the present inventive concept is not limited thereto. In another exemplary embodiment of the inventive concept, the upper layer UL may be between the first organic insulating layer 209 and the contact metal layer CM as shown in FIG. 17, and may be between the second organic insulating layer 211 and the pixel electrode 221 as shown in FIG. 18.

The groove G will be described in detail below with reference to FIG. 9.

The groove G may be formed in a depth direction (−z-direction) of the multi-layered film ML. The groove G may be located above the substrate 100 and the buffer layer 201. In other words, an upper surface of the buffer layer 201 may be exposed through the groove G. The upper surface of the buffer layer 201 being exposed through the groove G may mean that a bottom surface of the groove G and the upper surface of the buffer layer 201 may be located on the same plane.

Figure 13:
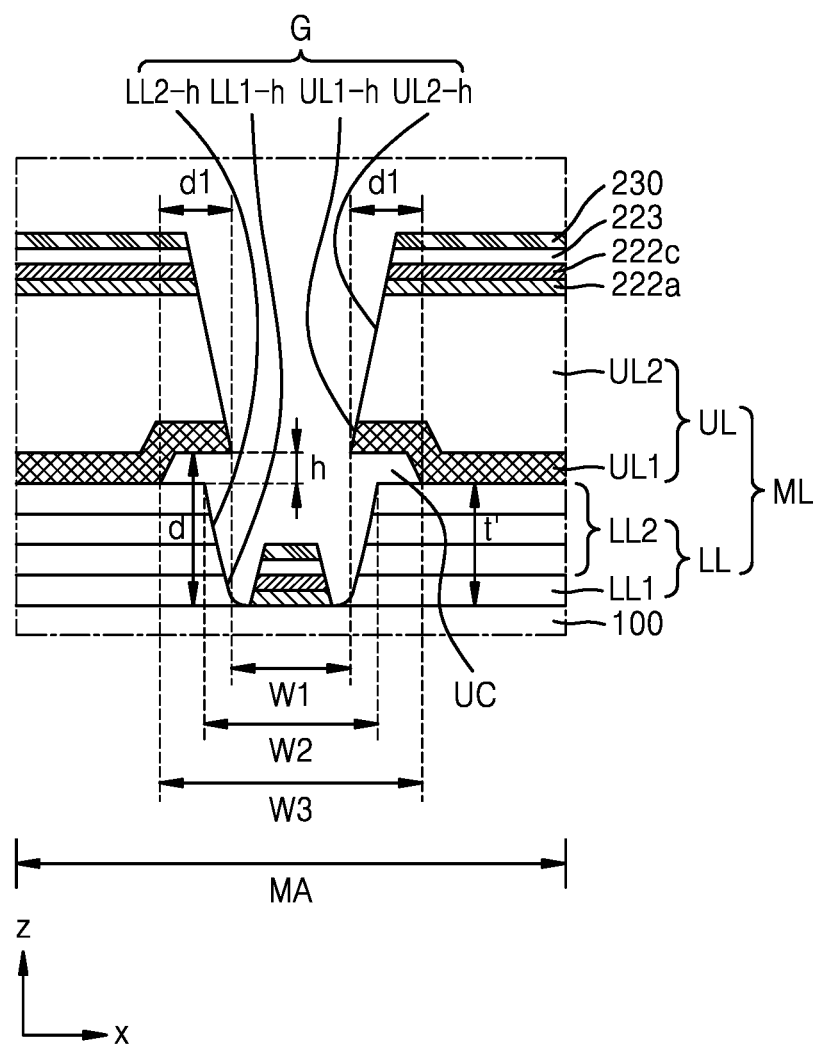

In another exemplary embodiment of the inventive concept, as shown in FIG. 13, the groove G may be formed to expose the upper surface of the substrate 100. In this case, the bottom surface of the groove G and the upper surface of the substrate 100 may be located on the same plane. In another exemplary embodiment of the inventive concept, the bottom surface of the groove G may be located on the same plane as a virtual surface between the upper surface of the substrate 100 and an upper surface of the lower layer LL. In this case, a recess to form the groove G may be included in the lower layer LL.

The groove G may include an upper-hole UL-h penetrating the upper layer UL and a lower-hole or a lower-recess formed in the lower layer LL. In an exemplary embodiment of the inventive concept, as shown in FIG. 9, the groove G may include the upper-hole UL-h of the upper layer UL and a lower-hole LL-h of the lower layer LL. The lower layer LL may include the lower-recess which does not completely penetrate the lower layer LL. When the lower-recess is included, the bottom surface of the groove G may be located on the same plane as a virtual surface between the upper surface of the substrate 100 and the upper surface of the lower layer LL.

The groove G may have an undercut UC structure. In FIG. 9, a first width W1 of the upper layer UL may be less than a second width W2 of the lower layer LL. In addition, in an exemplary embodiment of the inventive concept, the upper layer UL may include at least one or more steps. Due to the step of the upper layer UL, the undercut UC structure of the groove G may be formed to have a third width W3 which is greater than the second width W2 of the lower layer LL. The step of the upper layer UL may refer to a portion of the upper layer UL where it is separated from the lower layer LL by a gap.

Ends of the upper layer UL protruding toward the groove G, e.g., toward the center of the groove G may from a pair of tips PT. In the present embodiment, each of the tips PT may be a portion where the bottom surface of the upper layer UL is separated from the upper surface of the lower layer LL by the step of the upper layer UL. Accordingly, as shown in FIG. 9, each of the tips PT may be separated from the upper surface of the lower layer LL by a first height h. The first height h may be same as the height of the step of the upper layer UL.

A protruding length d1 of each of the tips PT may be less than a depth d of the groove G. The protruding length d1 of the tip PT may be less than about 2 μm. For example, the protruding length d1 of the tip PT may be 1 μm to 1.5 μm. The depth d of the groove G may be about 2 μm or more, 2.5 μm or more, 3 μm or more, or 3.5 μm or more. As described above, the depth d of the groove G may be formed greater than a thickness t of the lower layer LL by the step of the upper layer UL.

As described above, organic material layer(s) included in the laminated structure of the organic light-emitting diode (OLED in FIG. 8) may be cut off or separated by the groove G. For example, the first functional layer 222a and the second functional layer 222c may be cut-off or separated around the groove G (with the groove G as a center), as shown in FIG. 9. Similarly, the opposite electrode 223 and the capping layer 230 may be cut-off or separated around the groove G (with the groove G as a center). Although FIG. 9 and FIGS. 11 to 20 to be described below illustrate that the first functional layer 222a, the second functional layer 222c, the opposite electrode 223, and the capping layer 230 are cut-off or separated around the groove G (with the groove G as a center), the present inventive concept is not limited thereto. As described above, the second functional layer 222c and/or the capping layer may be omitted, and in this case, the second functional layer 222c and/or the capping layer 230 which are omitted may not exist around the groove G.

FIGS. 10A to 10D are cross-sectional views illustrating a manufacturing process of the groove G according to an exemplary embodiment of the inventive concept.

Figure 10A:
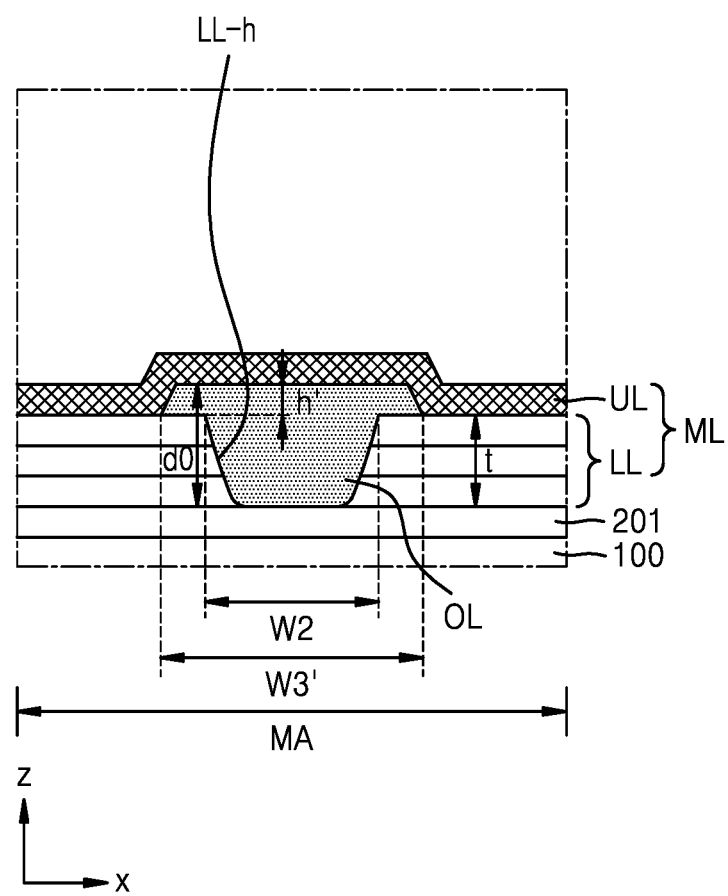
FIGS. 10A, 10B, 10C and 10D are cross-sectional views illustrating a process of forming a groove G according to an exemplary embodiment of the inventive concept.

Referring to FIG. 10A, the lower-hole LL-h is first formed in the lower layer LL. As described above, the lower layer LL may be located on the buffer layer 201 located on the substrate 100, but the lower layer LL may include the buffer layer 201 in some cases.

Then, an organic layer OL may be formed above the lower-hole LL-h. The organic layer OL may be formed to be embedded in the lower-hole LL-h. The organic layer OL may be formed with a first depth do and the first depth do of the organic layer OL may be greater than the thickness t of the lower layer LL. An upper surface of the organic layer OL may be formed to be higher than the upper surface of the lower layer LL by a first height h'. As shown in FIG. 9, the first height h' may be the same as the first height h of the step of the upper layer UL The width W3' of the organic layer OL located above the lower layer LL may be formed greater than a second width W2 of the lower-hole LL-h. However, the present inventive concept is not limited thereto. For example, the width W3' of the organic layer OL may be the same as the second width W2 of the lower-hole LL-h. Next, the upper layer UL may be formed to cover the organic layer OL.

Figure 10B:
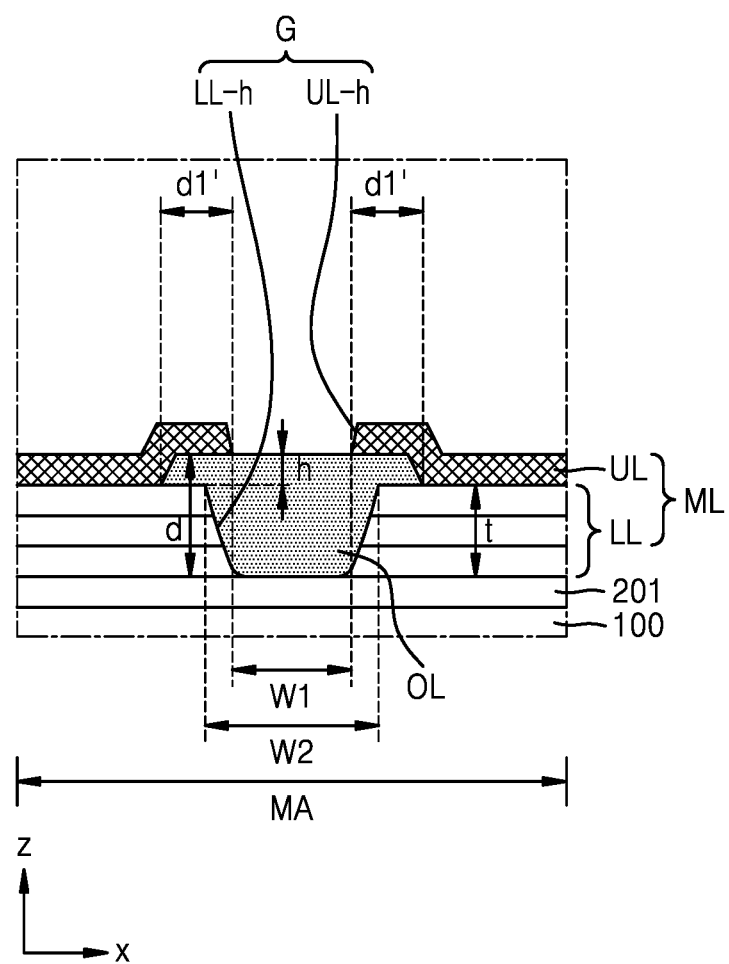

Referring to FIG. 10B, the upper-hole UL-h may be formed in the upper layer UL to correspond the lower-hole LL-h. As described above, a first width W1 of the upper-hole UL-h may be formed to be less than the second width W2 of the lower-hole LL-h to accommodate the undercut UC structure. At least a portion of an upper surface of the organic layer OL may be exposed through the upper-hole UL-h.

An end of the organic layer OL and an end of the upper-hole UL-h may be formed to have a certain length d1' and the length d1' may be the same as the protruding length d1 of the tips PT described above in FIG. 9.

Figure 10C:
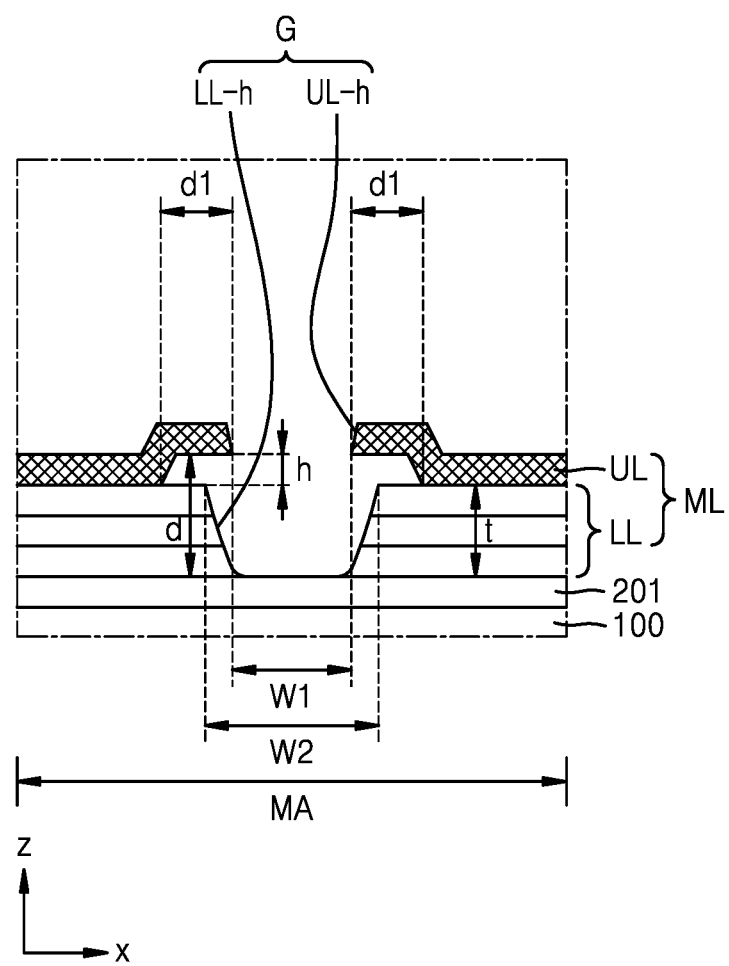

Then, the organic layer OL may be removed through the upper-hole UL-h. The organic layer OL may be removed by a wet-etch or a dry-etch. A shape as shown in FIG. 10C may be obtained after removing the organic layer OL. By removing the organic layer OL, the groove G including the lower-hole LL-h and the upper-hole UL-h may be formed.

Figure 10D:
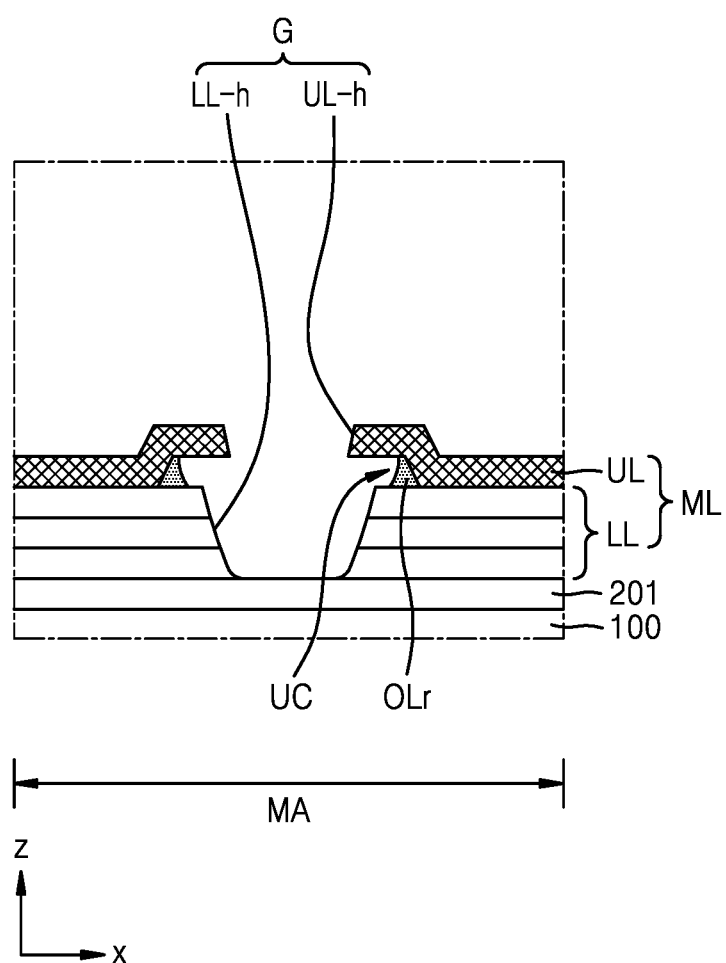

As shown in FIG. 10D, a residual layer OLr may be included in the groove G. The residual layer OLr may be a portion of the organic layer OL that was not removed in the process of removing the organic layer OL in FIG. 10B. The residual layer OLr may remain in the undercut UC structure of the groove G.

As shown in FIGS. 10C and 10D, after removing the organic layer OL, organic material layer(s) included in the laminated structure on the upper layer UL may be cut-off or separated by the groove G.

Figure 11:
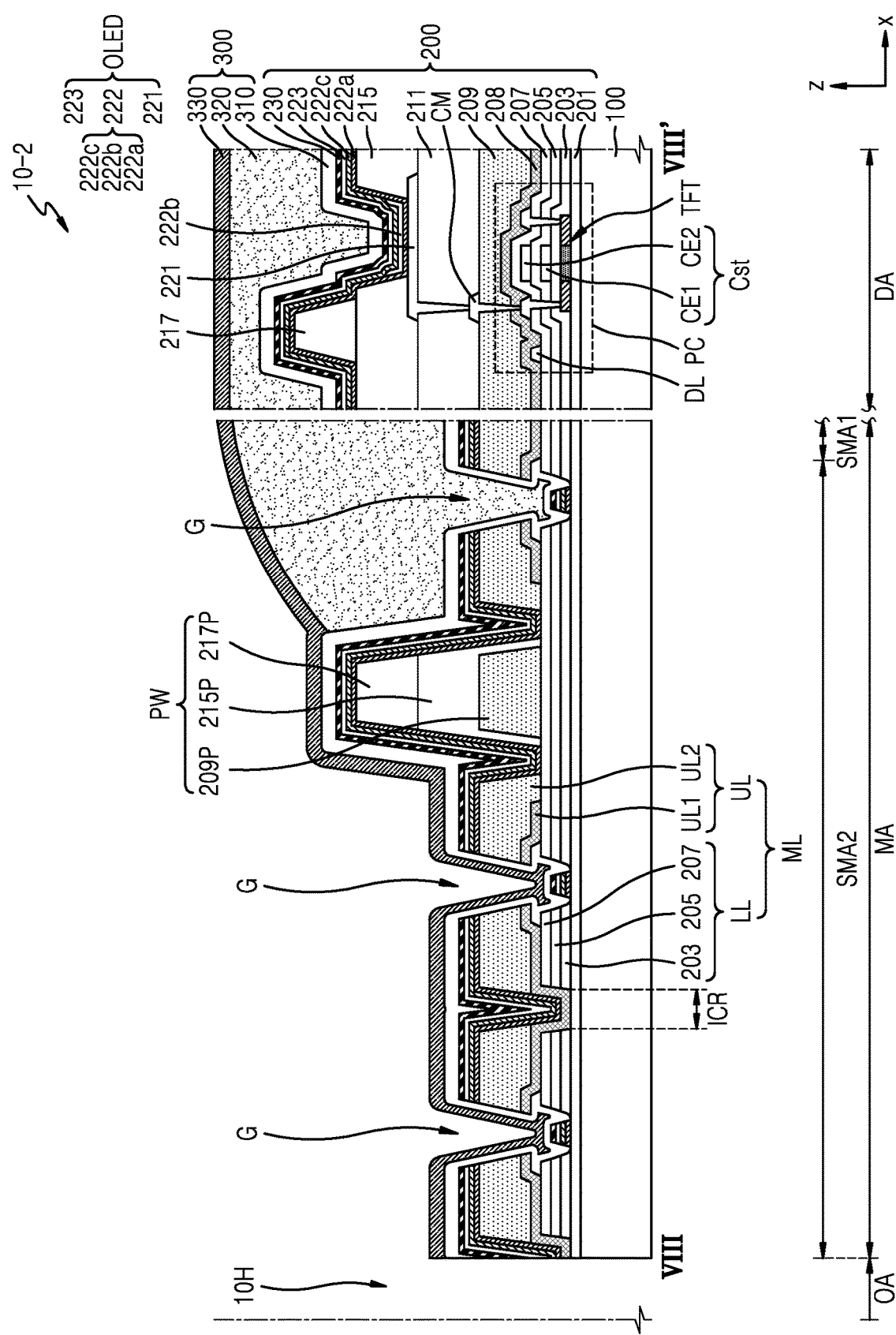
FIGS. 11, 12 and 13 are cross-sectional views of a portion of a display panel according to an exemplary embodiment of the inventive concept.
Figure 12:
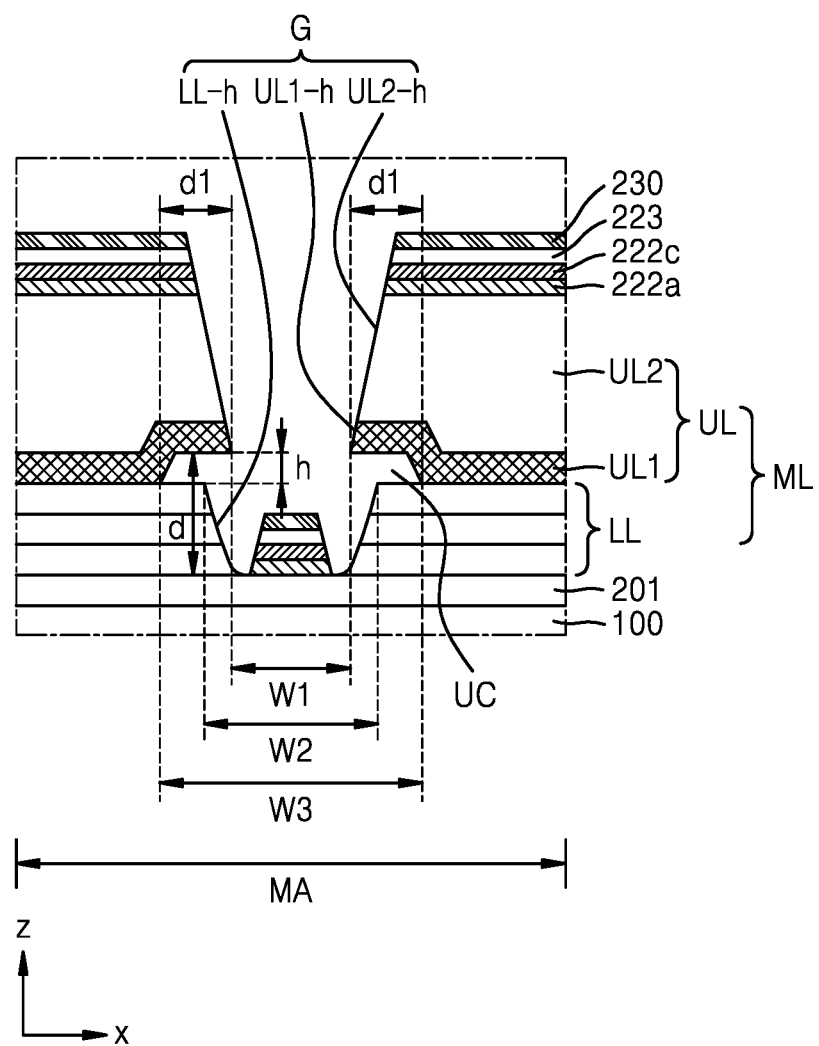

FIGS. 11 to 13 are cross-sectional views of a portion of a display panel 10-2 according to an exemplary embodiment of the inventive concept, FIG. 12 is an enlarged view of a portion of FIG. 11, and FIG. 13 is a modified embodiment of FIG. 11.

Referring to FIG. 11, the structure of the display area DA of the display panel 10-2 of the present embodiment may be the same as that of FIG. 8, but the structure of the middle area MA, in other words, the structure of the groove G is different from the above-mentioned embodiments. Hereinafter, differences between the structures of the groove G will be mainly described.

The groove G is defined in the multi-layered film ML and the multi-layered film ML includes the upper layer UL and the lower layer LL. The lower layer LL may include at least one inorganic insulating film and may include a plurality of inorganic insulating films 203, 205, and 207 as shown in FIG. 11. The plurality of inorganic insulating films may each include the same material as the gate insulating layer 203, the first interlayer insulating layer 205, and the second interlayer insulating layer 207 in the display area DA.

The upper layer UL may be located above the lower layer LL. The structure of the upper layer UL in FIG. 11 (or FIG. 12) is different from that of FIG. 8 (or FIG. 9). In the present embodiment, the upper layer UL may include a first sub-upper layer UL1 and a second sub-upper layer UL2 above the first sub-upper layer UL1.

The first sub-upper layer UL1 may include an inorganic material. The first sub-upper layer UL1 may include a conductive oxide such as IZO, ITO, ZnO, $In_2O_3$, IGO, and/or AZO. In addition, the inorganic material may include a metal such as Mo, Al, Cu, and/or Ti. Furthermore, the inorganic material may include an insulating material such as silicon nitride, silicon oxide, and/or silicon oxynitride.

The second sub-upper layer UL2 may include an organic insulating material. The second sub-upper layer UL2 may include a polymer such as PMMA or PS, a polymer derivative having a phenol group, and an organic insulating material such as an acrylic polymer, an imide polymer, an aryl ether polymer, an amide polymer, a fluorine polymer, a p-xylene polymer, a vinyl alcohol polymer, and a mixture thereof.

FIG. 11 illustrates that the first sub-upper layer UL1 includes the same material as the inorganic insulating layer 208 in the display area DA and the second sub-upper layer UL2 includes the same material as the first organic insulating layer 209 in the display area DA, but the present inventive concept is not limited thereto. In another exemplary embodiment of the inventive concept, the first sub-upper layer UL1 may include the same material as the data line DL or the contact metal layer CM in the display area DA, and the second sub-upper layer UL2 may include the same material as the first organic insulating layer 209 or the second organic insulating layer 211 located above the data line DL or the contact metal layer CM in the display area DA.

The second sub-upper layer UL2 may be omitted. However, as described above, since a portion of the first sub-upper layer UL1 is formed to be apart from the upper surface of the lower layer LL by a step, the second sub-upper layer UL2 may be located on the first sub-upper layer UL1 to support the first sub-upper layer UL from above, thereby increasing the structural reliability of a display panel.

The groove G will be described in detail below with reference to FIG. 12.

The groove G may be formed in the depth direction of the multi-layered film ML. The groove G may be located above the substrate 100 and the buffer layer 201. In other words, the upper surface of the buffer layer 201 may be exposed through the groove G. The upper surface of the buffer layer 201 being exposed through the groove G may mean that the bottom surface of the groove G and the upper surface of the buffer layer 201 may be located on the same plane.

The groove G may include an upper-hole penetrating the upper layer UL and a lower-hole or a lower-recess formed in the lower layer LL. In an exemplary embodiment of the inventive concept, as shown in FIG. 12, the groove G may include a first upper-hole UL1-$h$ of the first sub-upper layer UL1, a second upper-hole UL2-$h$ of the second sub-upper layer UL2, and a lower-hole LL-h of the lower layer LL.

The groove G may have an undercut UC structure. In FIG. 12, the width of the upper layer UL, for example, a first width W1 of the first upper-hole UL1-$h$ may be less than a second width W2 of the lower layer LL. In addition, in the present embodiment, the upper layer UL may include at least one step. For example, the upper layer UL may include a step at opposite sides of the groove G. Due to the step of the upper layer UL, the undercut UC structure of the groove G may be formed to have a third width W3 which is greater than the second width W2 of the lower layer LL.

Ends of the upper layer UL protruding toward the groove G, e.g., toward the center of the groove G, for example, the ends of the first sub-upper layer UL1 may form a pair of tips PT. The protruding length d1 of each of the tips PT may be less than the depth d of the groove G. The protruding length d1 of the tip PT may be less than about 2 μm. For example, the protruding length d1 of the tip PT may be 1 μm to 1.5 μm. The depth d of the groove G may be about 2 μm or more, 2.5 μm or more, 3 μm or more, or 3.5 μm or more.

The structure of the groove G in FIG. 13 is different from that of FIG. 12.

The groove G may be formed to cover the upper surface of the substrate 100. In this case, the bottom surface of the groove G and the upper surface of the substrate 100 may be located on the same plane. In another exemplary embodiment of the inventive concept, the bottom surface of the groove G may be located on the same plane as a virtual surface between the upper surface of the substrate 100 and an upper surface of the lower layer LL. In this case, a recess to form the groove G may be included in the lower layer LL.

The groove G is provided in the multi-layered film ML and the multi-layered film ML includes the upper layer UL and the lower layer LL. In FIG. 13, the lower layer LL may include a first sub-lower layer LL1 and a second sub-lower layer LL2 including at least one inorganic insulating film. The first sub-lower layer LL1 may include the same material as the buffer layer 201 in the display area DA and the second sub-lower layer LL2 may include the same material as the gate insulating layer 203, the first interlayer insulating layer 205, and the second interlayer insulating layer 207 in the display area DA.

The groove G may be formed to cover the upper surface of the substrate 100. The groove G may include first and second upper-holes UL1-$h$ and UL2-$h$ penetrating the upper layer UL and first and second lower-holes LL1-$h$ and LL2-$h$ formed in the lower layer LL. The groove G may include the first upper-hole UL1-$h$ of the first sub-upper layer UL1, the second upper-hole UL2-$h$ of the second sub-upper layer UL2, the first lower-hole LL1-$h$ of the first sub-lower layer LL1, and the second lower-hole LL2-$h$ of the second sub-lower layer LL2.

Figure 14:
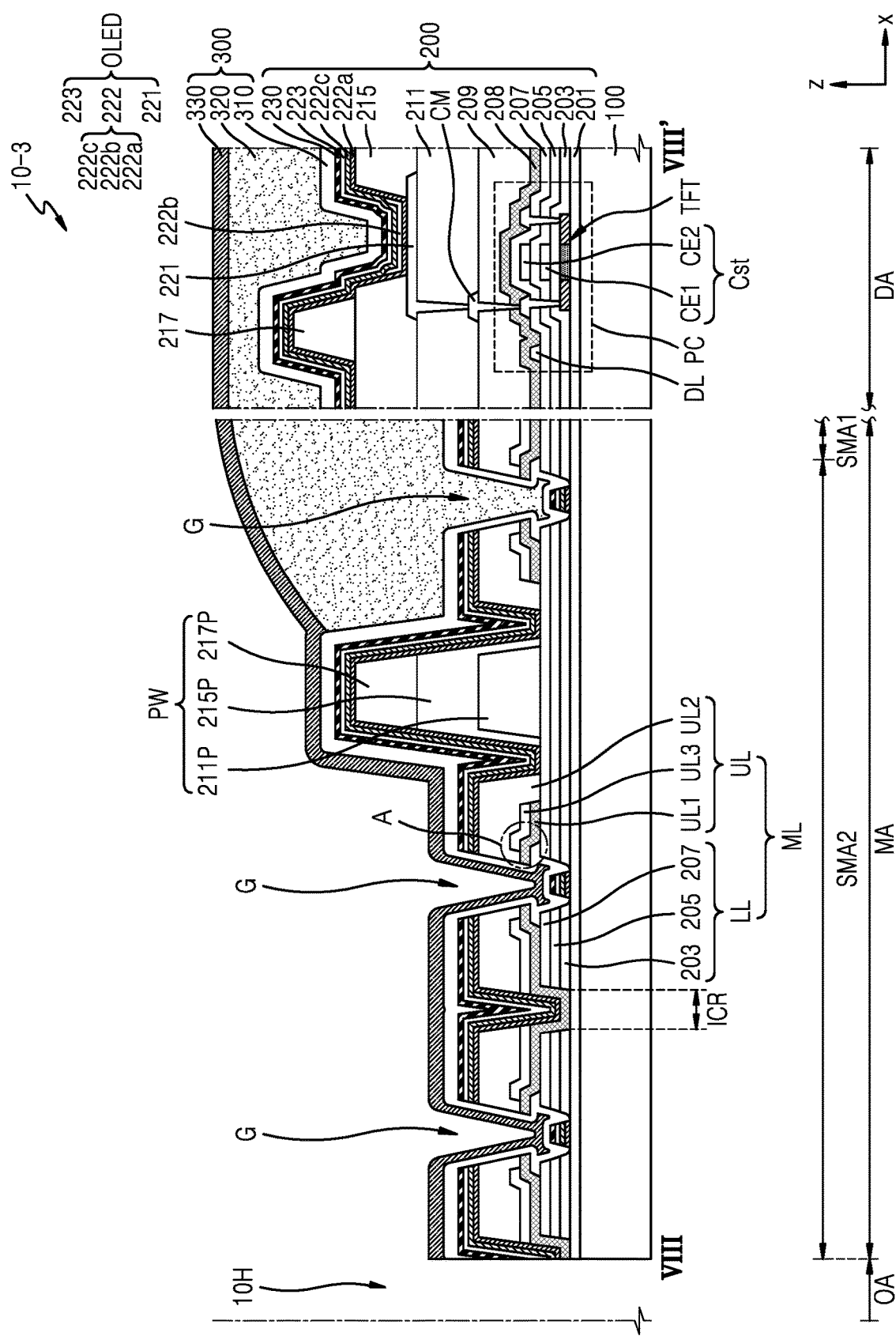
FIG. 14 is a schematic cross-sectional view of a portion of a display panel according to an exemplary embodiment of the inventive concept.
Figure 15:
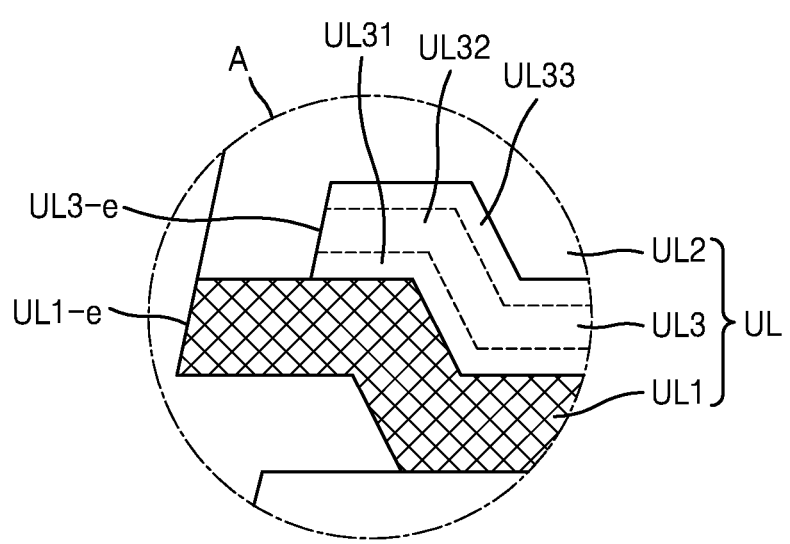
FIG. 15 is an enlarged view of a portion of the display panel of FIG. 14.

FIG. 14 is a schematic cross-sectional view of a portion of a display panel 10-3 according to an exemplary embodiment of the inventive concept and FIG. 15 is an enlarged view of a portion A of FIG. 14.

Referring to FIG. 14, the display area DA of FIG. 14 is the same as that of FIG. 8, but differs in the structure of the middle area MA.

The groove G is provided in the multi-layered film ML and the multi-layered film ML includes the upper layer UL and the lower layer LL. The lower layer LL may include at least one inorganic insulating film. The lower layer LL may include the same material as the gate insulating layer 203, the first interlayer insulating layer 205, and the second interlayer insulating layer 207 in the display area DA.

The upper layer UL may include the first sub-upper layer UL1, the second sub-upper layer UL2 located above the first sub-upper layer UL1, and a third sub-upper layer UL3 between the first sub-upper layer UL1 and the second sub-upper layer UL2. The third sub-upper layer UL3 may be located directly on the first sub-upper layer UL1 and may support the first sub-upper layer UL1. In an exemplary embodiment of the inventive concept, the first sub-upper layer UL1 may include the same material as the inorganic insulating layer 208 in the display area DA, the second sub-upper layer UL2 may include the contact metal layer CM in the display area DA, and the third sub-upper layer UL3 may include the same material as the second organic insulating layer 211 in the display area DA.

In this case, the first organic insulating layer 209 between the inorganic insulating layer 208 and the contact metal layer CM in the display area DA may be removed from the middle area MA. Accordingly, the partition PW located in the middle area MA may be formed by stacking a portion 211P of a layer forming the second organic insulating layer 211, a portion 215P of a layer forming the pixel defining film 215, and a portion 217P of a layer forming the spacer 217. The height from the upper surface of the substrate 100 to the upper surface of the partition PW may be lower than the height from the upper surface of the substrate 100 to the upper surface of the spacer 217.

In the present embodiment, the second sub-upper layer UL2 may be provided to cover the third sub-upper layer UL3. Referring to FIG. 15, the third sub-upper layer UL3 may be located above the first sub-upper layer UL1 and the second sub-upper layer UL2 may cover the third sub-upper layer UL3. An end UL1-*e* of the first sub-upper layer UL1 may protrude toward the center of the groove G more than an end UL3-*e* of the third sub-upper layer UL3. In other words, the end UL3-*e* of the third sub-upper layer UL3 may be located closer to the partition PW than the end UL1-*e* of the first sub-upper layer UL1.

The second sub-upper layer UL2 may be located to cover the end UL3-*e* of the third sub-upper layer UL3. As shown in FIG. 15, the third sub-upper layer UL3 may have a structure in which a plurality of layers UL31, UL32, and UL33 are stacked. The plurality of layers UL31, UL32, and UL33 may form, for example, a structure in which Ti/Al/Ti are sequentially stacked. The third sub-upper layer UL3, which is three layers of Ti/Al/Ti, may be formed in the same mask process as the contact metal layer CM. As described above, when the third sub-upper layer UL3 is a multilayer including aluminum such as Ti/Al/Ti, the third sub-upper layer UL3 may be easily damaged in the process. Accordingly, titanium, which is relatively strong, may form the second sub-upper layer UL2 that covers the end UL3-*e* of the third sub-upper layer UL3 to prevent any aluminum damage to a side surface (in other words, the end UL3-*e*) of the third sub-upper layer UL3 from forming a concave and convex shape or an undercut.

Figure 16:
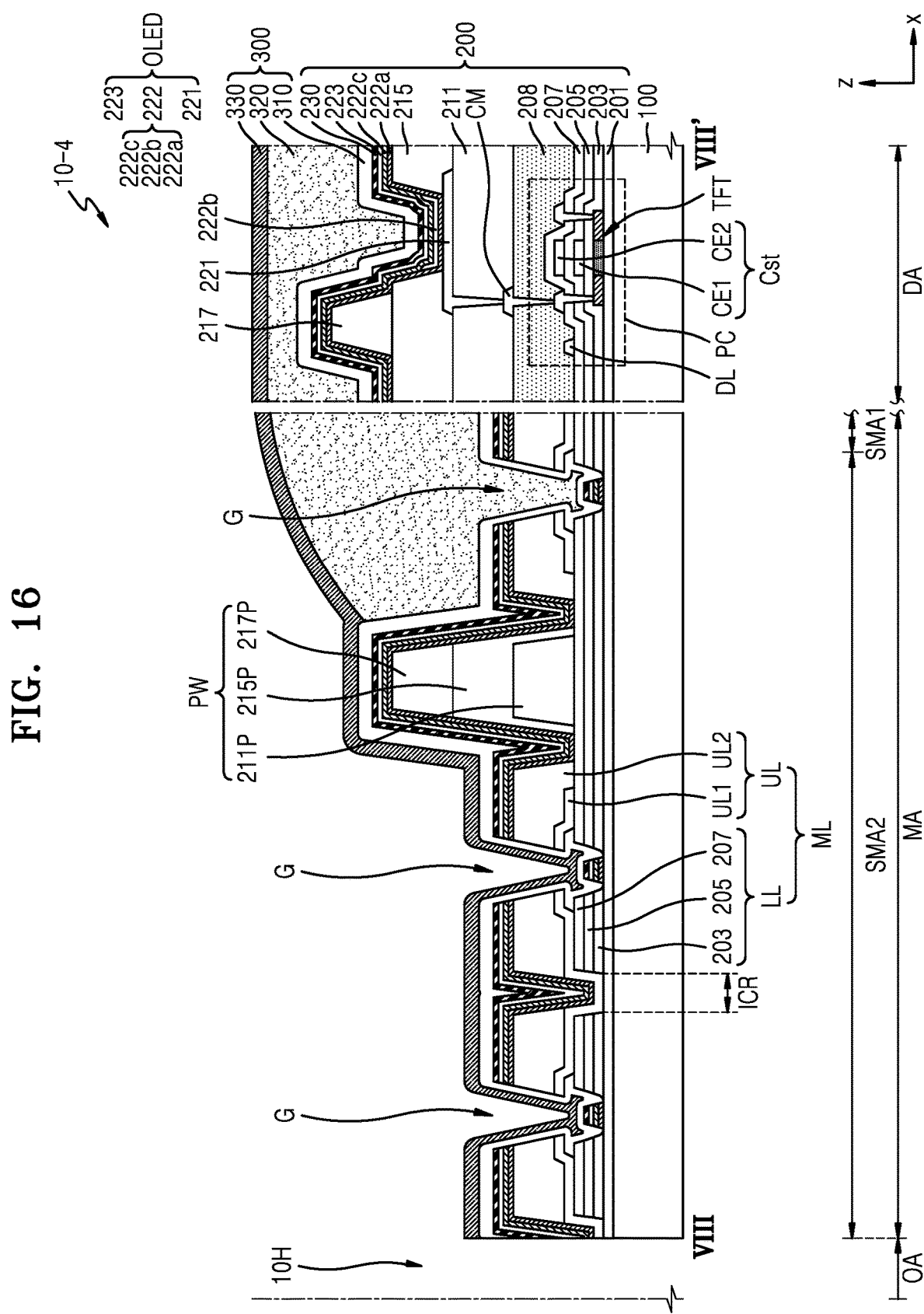
FIGS. 16, 17 and 18 are schematic cross-sectional views of a portion of a display panel according to an exemplary embodiment of the inventive concept.

FIGS. 16 to 18 are schematic cross-sectional views of a portion of a display panel according to an exemplary embodiment of the inventive concept. The display panels in FIGS. 16 to 18 are modified examples of FIG. 8. Hereinafter, duplicated contents will be omitted and differences will be mainly described.

Referring to FIG. 16, the structure of the groove G is similar to that of FIG. 11, but the structure of the upper layer UL is different from that of FIG. 11. The upper layer UL may include the first sub-upper layer UL1 and the second sub-upper layer UL2 located above the first sub-upper layer UL1. The first sub-upper layer UL1 may include a metal layer and the second sub-upper layer UL2 may include an organic insulating material. In the present embodiment, the first sub-upper layer UL1 may include the same material as the contact metal layer CM in the display area DA, and the second sub-upper layer UL2 may include the same material as the second organic insulating layer 211 in the display area DA.

The inorganic contact region ICR is located in the middle area MA, in other words, the second sub-middle area SMA2, and is a direct contact region of layers including an inorganic material. The inorganic contact region ICR having a metal-inorganic material contact may be formed by allowing the first sub-upper layer UL1, which is a metal layer, to directly contact the buffer layer 201.

Depths d' and d" of the groove G in FIGS. 17 and 18 are different from those of the above-mentioned embodiments. As shown in FIGS. 17 and 18, the groove G includes the lower layer LL and the upper layer UL. The lower layer LL includes a plurality of inorganic insulating layers and the upper layer UL includes the first sub-upper layer UL1 including an inorganic material and the second sub-upper layer UL2 including the organic insulating material.

Referring to FIG. 17, the inorganic insulating layer 208 in the display area DA may be between the first organic insulating layer 209 and the contact metal layer CM. The inorganic insulating layer 208 may include the same material as the upper layer UL of the groove G in the middle area MA, for example, the first sub-upper layer UL1. The second sub-upper layer UL2 may include the same material as the second organic insulating layer 211 in the display area DA. A third sub-upper layer similar to FIG. 14 may be between the first sub-upper layer UL1 and the second sub-upper layer UL2. The third sub-upper layer may include the same material as the contact metal layer CM in the display area DA.

The depth d' of the groove G in FIG. 17 may be formed deeper than the above-described embodiments. The groove G may form an organic layer in the groove G and remove the organic layer, similarly to FIGS. 10A to 10C. The depth d' of the groove G may be controlled by using organic layer(s) stacked ahead of the first sub-upper layer UL1 in which the tip PT is formed. A portion of the first organic insulating layer 209 below the inorganic insulating layer 208 in the display area DA may fill the groove G and the first organic insulating layer 209 may be removed to increase the depth d' of the groove G by a thickness of the first organic insulating layer 209 compared to the above-described embodiments.

Similarly, the depth d" of the groove G in FIG. 18 may be formed to be greater than the depth d' of the groove G of FIG. 17. The depth d' of the groove G may be controlled by using the organic layers that are stacked ahead of the first sub-upper layer UL1 in which the tip PT is formed, such as the first organic insulating layer 209 and the second organic insulating layer 211. For example, a portion of the first organic insulating layer 209 and the second organic insulating layer 211 located below the inorganic insulating layer 208 in the display area DA may fill the groove G and the first organic insulating layer 209 and the second organic insulating layer 211 may be removed to increase the depth d" of the groove G by a thickness of the first organic insulating layer 209 and the second organic insulating layer 211 compared to the above-described embodiments.

Figure 19:
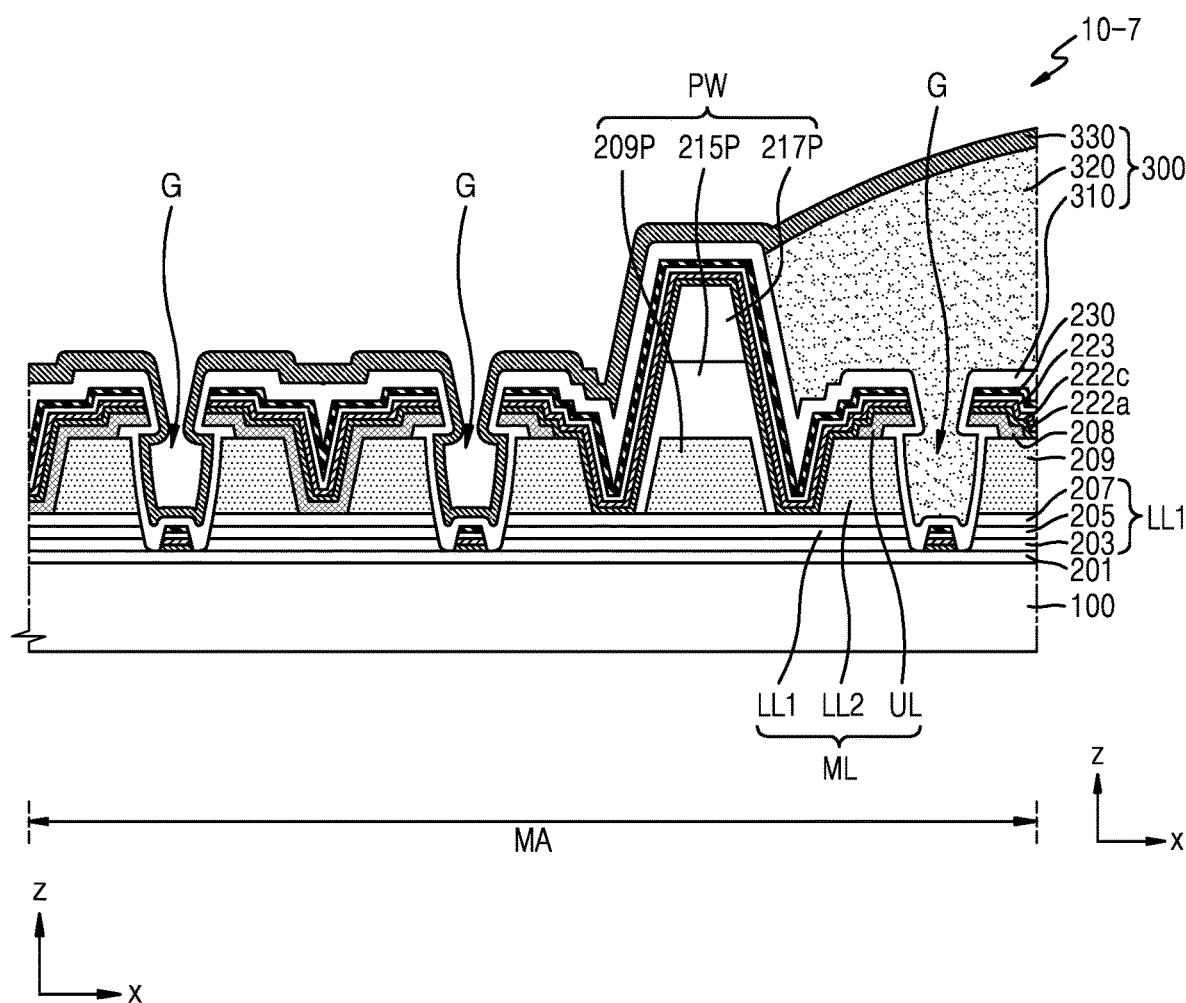
FIGS. 19, 20 and 21 are schematic cross-sectional views of a portion of a display panel according to an exemplary embodiment of the inventive concept.
Figure 20:
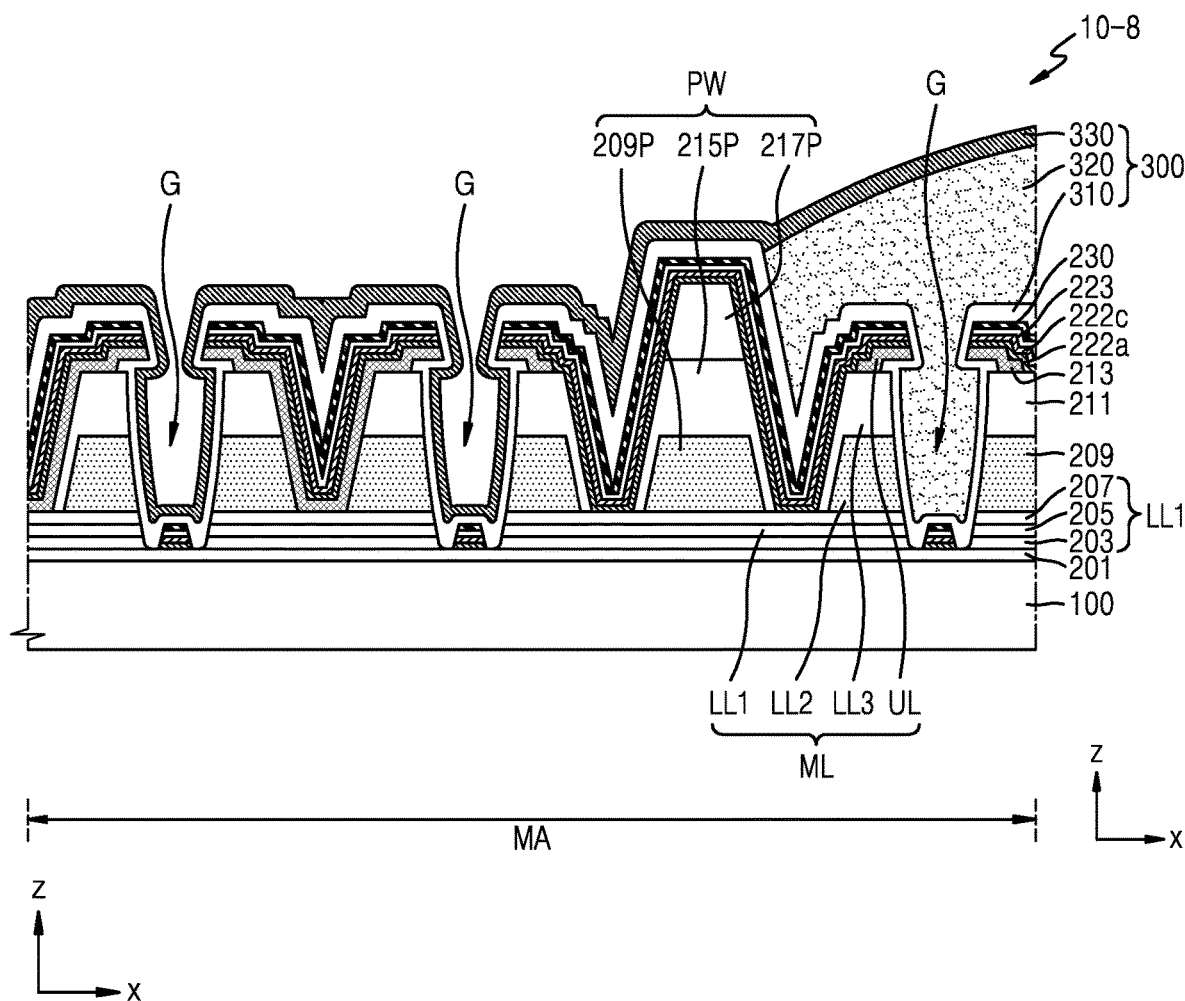
Figure 21:
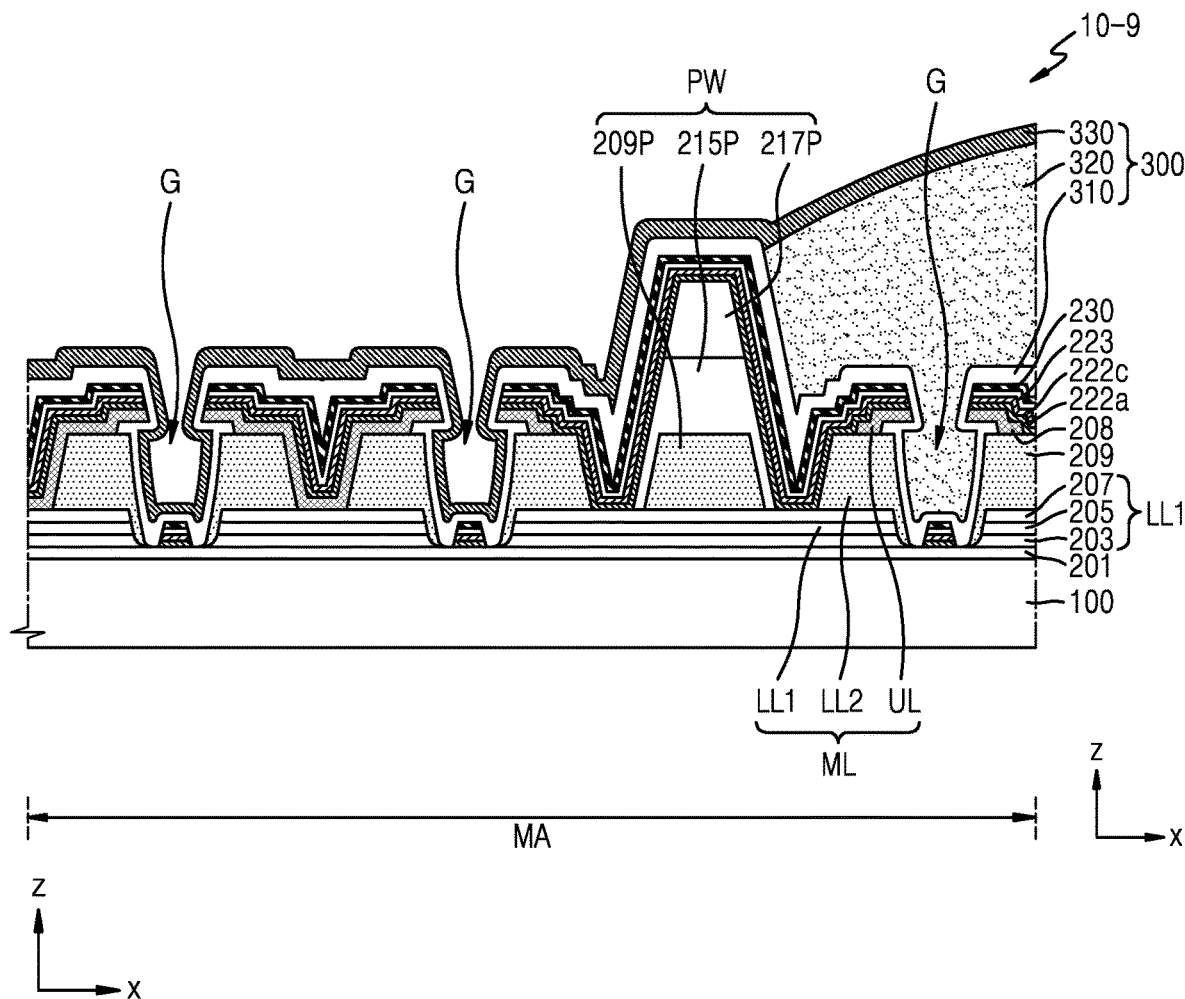

FIGS. 19, 20 and 21 are schematic cross-sectional views of a portion of a display panel according to an exemplary embodiment of the inventive concept. The display panels in FIGS. 19, 20 and 21 are modified examples of FIG. 8. Hereinafter, duplicated contents will be omitted and differences will be mainly described.

Referring to FIG. 19, the structure of the groove G is similar to that of FIG. 8, but the structure of the lower layer LL is different from that of FIG. 8. The groove G is provided in the multi-layered film ML and the multi-layered film ML includes the lower layer LL and the upper layer UL. In the present embodiment, the lower layer LL may include the first sub-lower layer LL1 and the second sub-lower layer LL2 located above the first sub-lower layer LL1.

The first sub-lower layer LL1 may include an inorganic insulating material and the second sub-lower layer LL2 may include an organic insulating material. The first sub-lower layer LL1 may include at least one inorganic insulating layer and the inorganic insulating layer in FIG. 19 may include a portion of the gate insulating layer 203, the first interlayer insulating layer 205, and the second interlayer insulating layer 207. The second sub-lower layer LL2 may include a portion of the first organic insulating layer 209. The upper layer UL including an inorganic layer may be included above the second sub-lower layer LL2 and the upper layer UL may have a step with an elevation higher than the upper surface of the lower layer LL, for example, the second sub-lower layer LL2, as in the above-described embodiments.

Referring to FIG. 21, the second sub-lower layer LL2 covers a side of the first sub-lower layer LL1 in the groove G.

The structure of the partition PW in FIGS. 19 and 21 is the same as that of FIG. 8, and the repeated description is omitted.

Referring to FIG. 20, the groove G is provided in the multi-layered film ML and the multi-layered film ML includes the lower layer LL and the upper layer UL. In the present embodiment, the lower layer LL may include the first sub-lower layer LL1, the second sub-lower layer LL2 located above the first sub-lower layer LL1, and the third sub-lower layer LL3 located above the second sub-lower layer LL2.

The first sub-lower layer LL1 and the second sub-lower layer LL2 are the same as that of FIG. 19 and FIG. 20 differs from FIG. 19 in that the third sub-lower layer LL3 is further included. The third sub-lower layer LL3 may include a portion of the second organic insulating layer 211. The upper layer UL may include an inorganic layer and may be located directly on the second organic insulating layer 211. Like the above-described embodiments, the upper layer UL may have a step having an elevation higher than the upper surface of the lower layer LL, for example, the third sub-lower layer LL3.

The structure of the partition PW in FIG. 20 is the same as that of FIG. 8 and the repeated description is omitted.

The display panel according to the exemplary embodiments of the present inventive concept may prevent external impurities such as moisture around the first area from damaging the display elements. It is to be understood, however, that other effects and characteristics of the inventive concept are illustrated and can be gleaned from the above description.

While the inventive concept has been described with reference to one or more exemplary embodiments thereof, it will be understood by those of ordinary skill in the art that various changes in form and details may be made thereto without departing from the spirit and scope of the inventive concept as set forth by the following claims.

What is claimed is:

1. A display panel comprising:
   a substrate comprising a first area, a second area, and a third area between the first area and the second area;
   a first structure located in the second area and comprising a pixel electrode, an opposite electrode, an intermediate layer between the pixel electrode and the opposite electrode, and at least one organic material layer; and
   a plurality of grooves located in the third area and separating the at least one organic material layer and the opposite electrode, wherein
   a first groove of the plurality of grooves is provided in a multi-layered film comprising a lower layer and an upper layer,
   the first groove comprises a first hole penetrating the upper layer and a second hole or recess in the lower layer, and
   a first width of the first hole is less than the a second width of the second hole or recess in a cross-sectional view.

2. The display panel of claim 1, wherein
   the second width is a distance between a first portion and a second portion of an edge of an upper surface of the lower layer, which face each other with respect to the second hole or recess, in a cross-sectional view.

3. The display panel of claim 1, wherein
   the upper layer comprises a tip protruding toward a center of the first hole, and
   a distance between a first portion and a second portion of the tip, which face each other with respect to the first hole, is less than the second width in a cross-sectional view.

4. The display panel of claim 3, wherein
   an undercut structure is between the tip and the lower layer, and
   a third width of the undercut structure is greater than the second width in a cross-sectional view.

5. The display panel of claim 3, wherein
   an undercut structure is between the tip and the lower layer, and
   a third width of the undercut structure is a same as the second width in a cross-sectional view.

6. The display panel of claim 1, wherein
   the upper layer comprises an inorganic material layer.

7. The display panel of claim 6, wherein
   the upper layer comprises a conductive oxide layer, a metal layer, or an inorganic insulating layer.

8. The display panel of claim 1, wherein
   the lower layer comprises an inorganic insulating film.

9. The display panel of claim 1, further comprising:
   a first opening located in the first area and penetrating the display panel.

10. The display panel of claim 1, further comprising:
    a thin-film encapsulation layer located above the first structure and comprising an inorganic encapsulation layer and an organic encapsulation layer,
    wherein the inorganic encapsulation layer is continuously arranged along an inner surface of the first groove.

11. The display panel of claim 1, further comprising:
    an opposite electrode pattern located in the first groove,
    wherein the opposite electrode pattern comprises a same material as the opposite electrode and is disconnected from the opposite electrode at a boundary of the first groove.

12. The display panel of claim 1, further comprising:
    an organic material layer pattern located in the first groove,
    wherein the organic material layer pattern comprises a same material as the at least one organic material layer and is disconnected from the at least one organic material layer at a boundary of the first groove.

13. The display panel of claim 1, wherein
    the intermediate layer comprises an light-emitting layer, and
    the at least one organic material layer comprises an first functional layer between the pixel electrode and the light-emitting layer and/or a second functional layer between the light-emitting layer and the opposite electrode.

14. The display panel of claim 13, further comprising:
    a pattern structure, in which a plurality of layers are stacked in a direction perpendicular to the substrate, the pattern structure being located in the first groove,
    wherein
    the pattern structure comprises layers respectively comprising same materials as the first functional layer, the second functional layer, and the opposite electrode, and
    the pattern structure is disconnected from the first functional layer, the second functional layer, and the opposite electrode at a boundary of the first groove.

15. A display panel comprising:
    a substrate comprising a first area, a second area, and a third area between the first area and the second area;
    a first structure located in the second area and comprising a pixel electrode, an opposite electrode, an intermediate layer between the pixel electrode and the opposite electrode, and at least one organic material layer; and a plurality of grooves located in the third area and separating the at least one organic material layer and the opposite electrode, wherein a first groove of the plurality of grooves is provided in a multi-layered film comprising a lower layer and an upper layer, the first groove comprises a first hole penetrating the upper layer and a second hole or recess in the lower layer, and a first edge of the upper layer in contact with a boundary surface of the first hole protrudes further toward a center of the first groove than a second edge of the lower layer in contact with a boundary surface of the second hole or recess.

16. The display panel of claim 15, wherein
a first distance between two portions of the first edge, which face each other with respect to the first hole, is less than a second distance between two portions, which face each other with respect to the second hole or recess, in a cross-sectional view.

17. The display panel of claim 16, wherein
an undercut structure is between the upper layer and the lower layer, and
a third distance between two portions of the undercut structure, which face each other with respect to the first groove, is greater than the second distance in a cross-sectional view.

18. The display panel of claim 16, wherein
an undercut structure is between the upper layer and the lower layer, and
a third distance between two portions of the undercut structure, which face each other with respect to the first groove, is a same as the second distance in a cross-sectional view.

19. The display panel of claim 15, wherein
the upper layer comprises a conductive oxide layer, a metal layer, or an inorganic insulating layer.

20. The display panel of claim 15, wherein
the lower layer comprises an inorganic insulating film.

* * * * *